United States Patent
Liu et al.

(10) Patent No.: US 6,485,564 B1
(45) Date of Patent: Nov. 26, 2002

(54) THIN FILM FORMING METHOD

(75) Inventors: Yijun Liu, Yamanashi (JP); Hiroshi Shinriki, Chiba (JP); Takashi Magara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/658,507

(22) Filed: Nov. 13, 2000

Related U.S. Application Data

(63) Continuation of application No. PCT/JP99/06991, filed on Dec. 13, 1999.

(30) Foreign Application Priority Data

Dec. 16, 1998 (JP) .......................................... 10-357945

(51) Int. Cl.$^7$ ............................................. C30B 23/00
(52) U.S. Cl. ............................ 117/95; 117/84; 117/93; 117/102; 117/105; 427/255.32; 427/255.36; 427/255.37
(58) Field of Search ................................ 117/84, 93, 95, 117/102, 105; 427/255.32, 255.36, 255.7

(56) References Cited

U.S. PATENT DOCUMENTS

| | | | |
|---|---|---|---|
| 5,776,254 A | 7/1998 | Yuuki et al. | 118/725 |
| 6,101,085 A * | 8/2000 | Kawahara et al. | 361/312 |
| 6,126,753 A * | 10/2000 | Shinriki et al. | 118/715 |
| 6,165,556 A * | 12/2000 | Kawahara et al. | 427/255.32 |

FOREIGN PATENT DOCUMENTS

| | | |
|---|---|---|
| EP | 0 849 780 | 6/1998 |
| JP | 8-176826 | 7/1996 |
| JP | 9-282943 | 10/1997 |

* cited by examiner

*Primary Examiner*—Felisa Hiteshew
(74) *Attorney, Agent, or Firm*—Finnegan Henderson Farabow Garrett & Dunner, L.L.P.

(57) ABSTRACT

In a thin film forming method of the invention, an atmosphere for a base as a thin film forming target is set to a high vacuum of, e.g., 0.01 Torr or less, and a gas of an organometallic compound and an oxidizing gas are introduced onto a base surface heated to about 450° C., to form a plurality of crystal nuclei, made of an oxide of a metal constituting the organometallic compound, on the base surface. The atmosphere for the base is then set to a lower vacuum than the first vacuum degree, and the gas of the organometallic compound and the oxidizing gas are subsequently introduced onto the base surface heated to about 45° C., to form a film made of the oxide of the metal there. In the above process, in the first step, the vacuum degree is set to a vacuum degree at which the oxide of the metal is formed by crystal growth on surfaces of different materials at the first temperature, and the plurality of crystal nuclei are formed at a high density so that a crystal grain which is formed by growing a crystal nucleus comes into contact with a crystal grain growing from an adjacent crystal nucleus. In the subsequent step, the temperature for the base is set to less than a temperature at which the oxide of the metal is formed by crystal growth on the surfaces of the different materials.

18 Claims, 10 Drawing Sheets

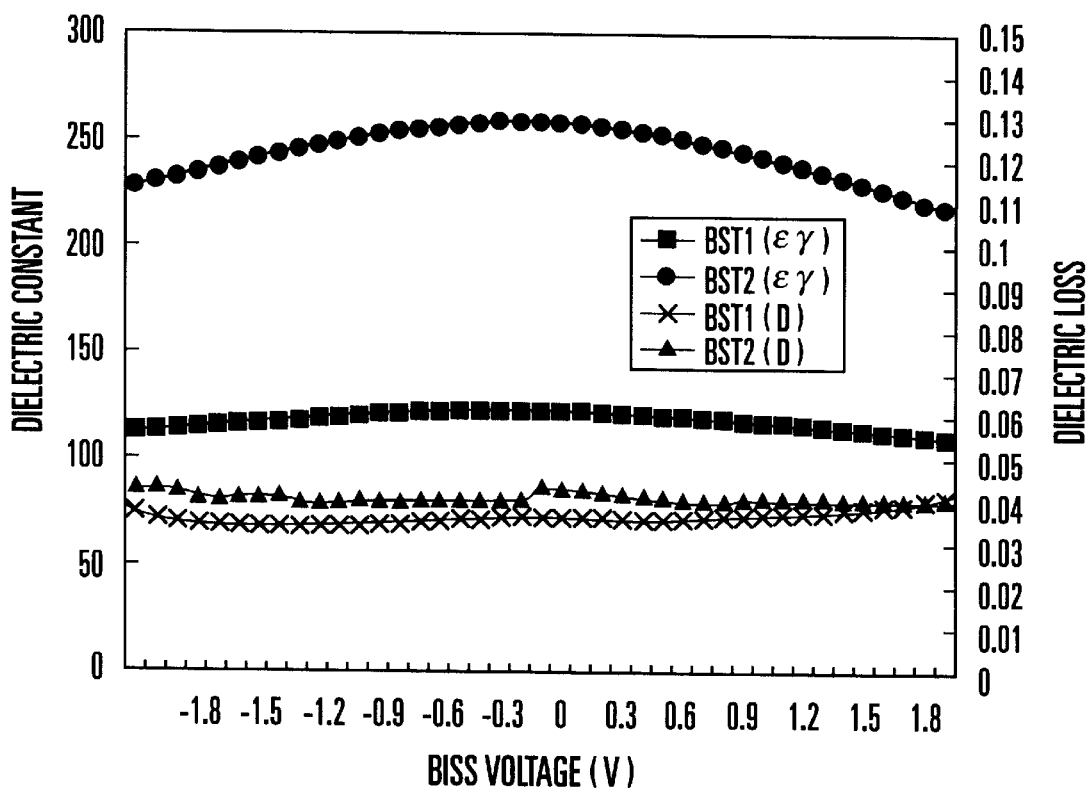
F I G. 5
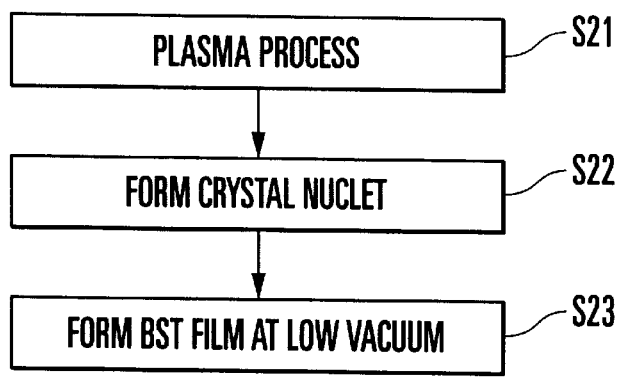
F I G. 6

THIN FILM FORMING METHOD

This is a continuation of PCT/JP99/06991 filed Dec. 13, 1999.

BACKGROUND OF THE INVENTION

The present invention relates to a thin film forming method and, for example, to (Ba, Sr)Ti$_3$ (barium strontium titanate: to be referred to as BST hereinafter) used in, e.g., a semiconductor memory device.

As the semiconductor integrating technique develops rapidly, downsizing and increases in speed and integration degree have been achieved in various types of components constituting a semiconductor integrated device. For example, in the field of semiconductor memory devices, in addition to the issues described above, an increase in capacity has been required, and development in technique is very fast. This will be described using an example. In a DRAM (Dynamic Random Access Memory) as one of typical semiconductor memory devices, downsizing and an increase in capacitance per unit area are sought for in a capacitor as one of the main constituent elements. As a dielectric material generally used to form the capacitor of a DRAM, silicon dioxide is generally used from the viewpoint of the semiconductor process. Since silicon dioxide has a dielectric constant of 10 or less and a capacitance per unit area of 4 fF/$\mu$m$^2$, it cannot cope with a requirement for an increase in capacitance per unit area. For this reason, recently, BST and the like with a dielectric constant higher than that of silicon dioxide have received a great deal of attention.

The arrangement of the DRAM described above will be briefly described.

FIG. 13 shows some DRAM memory cells formed on an Si substrate 1301. Each DRAM memory cell is constituted by a transistor 1302 and capacitor 1310. The transistor 1302 is connected to the capacitor 1310 through a plug 1303 connected to the drain terminal. The plug 1303 is formed in a contact hole formed in an interlevel insulating film 1304 made of an insulator such as silicon dioxide.

The plug 1303 is made of polysilicon which is doped with an impurity so as to be conductive, and is connected to a storage node 1305 serving as one electrode of the capacitor 1310. The storage node 1305 is formed on the flat interlevel insulating film 1304 and is made of, e.g., a platinum, ruthenium, or ruthenium oxide film. The storage node 1305 is connected to the plug 1303 through a barrier film 1303a made of, e.g., TiN.

A capacitor film 1306 is formed on the interlevel insulating film 1304 including the storage node 1305. A cell plate 1307 is formed on the capacitor film 1306, and forms the capacitor 1310 together with the storage node 1305 and capacitor film 1306. An upper interlevel insulating film 1308 is formed on the capacitor 1310. Although not shown, a word line to be connected to the gate of the transistor 1302, a bit line to be connected to the source terminal, and the like are arranged on the upper interlevel insulating film 1308. As described above, the capacitor film is formed to cover one electrode formed on the transistor through the interlevel insulating film 1304 and serving as a capacitor.

As the requirements needed for this capacitor film serving as a capacitor, first, the capacitor film must have a high dielectric constant. Examples of the material with such a high dielectric constant are compounds containing Ba, Sr, Ti, Pb, Zn, Bi, Ta, or the like. Second, the capacitor film must have a small leakage current.

Even if a material with a high dielectric constant is used, a DRAM of 1 Gbit or more cannot be implemented by a planar capacitor, and it is indispensable to employ a stereoscopic structure, as described above. To form a stereoscopic capacitor, a thin film forming method is required which can form a film with a uniform thickness, composition, and characteristics on the flat portion and side wall of the storage node of the stereoscopic structure and which has a good coverage on a complicated stepped shape.

As a thin film forming technique with the good step coverage, chemical vapor deposition (CVD) is available. With CVD, the source of a material for forming a thin film to be formed must be transported onto a substrate in the form of a gas. The most preferable CVD source is the one that takes the form of a gas in room temperature. When a gas is used as the source, it can be controlled well because its supply amount is determined by only the gas flow rate. However, of the elements described above that form a high dielectric or ferroelectric, no one forms a compound which is gaseous at room temperature. Accordingly, when a material with a high dielectric constant is to be formed by CVD, the source is supplied by means of bubbling. More strictly, if the source is a solid source, it is supplied by sublimation.

When the source is to be supplied by bubbling, if the source gas is liquid, supply amount control can be performed more stably. The requirement for the source gas is a high vapor pressure, that is, if possible, it must have a sufficiently high vapor pressure at room temperature or less. However, almost none of the elements described above forms a compound with a sufficiently high vapor pressure, and most of compounds that have some vapor pressure are organometallic compounds.

From the above viewpoint, barium titanate (BaTiO$_3$: BT), strontium titanate (SrTiO$_3$: ST), and BST as a solid solution of BT and ST have received attention as the material of the capacitor film of a DRAM that can be formed with CVD described above.

More specifically, BT and ST are high dielectric constant materials with a high dielectric constant of about 100, and BST is a high dielectric constant material with a high dielectric constant of about 200 to 300, thus satisfying one performance described above which is required for the capacitor film. Barium, strontium, and titanium can form organic compounds, and a BT, ST, or BST thin film can be formed by MO (Metal organic) CVD. This thin film forming method is thermal CVD which forms a metal or compound film at a comparatively low temperature (400° C. to 500° C.) by using an organometallic compound (MO). In this manner, a BT, ST, or BST thin film can be formed with CVD that provides a good step coverage, and satisfies the second performance described above which is required for the capacitor film.

When forming a BST film by MOCVD, generally, a substrate as a thin film forming target is heated and, e.g., evaporated Ba(thd)$_2$, Sr(thd)$_2$, and Ti(O—iPr)$_2$(thd)$_2$ are supplied onto the substrate, thus forming a BST film on the substrate. Ba(thd)$_2$ is a barium source, Sr(thd)$_2$ is a strontium source, and Ti(O—iPr)$_2$(thd)$_2$ is a titanium source.

If the substrate is heated to an excessively high temperature during formation of the BST film described above, the step coverage suffers. When the substrate has a step with an aspect ratio of 3 or more, it is heated to a temperature of 450° C. or less in order to set the step coverage to 90% or more. When the temperature is decreased, the film formation rate becomes low. Hence, when forming a BST film, the substrate is heated to about 450° C.

When a BST film is to be formed by MOCVD, unless the temperature of the substrate as the thin film forming target becomes 500° C. or more, the formed BST film cannot be set in a crystalline state wherein the formed BST film has a high dielectric constant enough use it as a capacitor film. More specifically, when a thin film is formed at a substrate temperature of about 450° C. described above, the obtained BST film is in the amorphous state and is thus not appropriate as a capacitor film. Therefore, conventionally, a BST film in a crystalline state, which can be used as a capacitor film, is formed by three-step thin film formation to have good step coverage (reference: Japanese Patent Laid-Open No. 8-176826).

First, a thin strontium titanate film (ST film) is formed by using a predetermined MOCVD apparatus at a substrate temperature where desired step coverage can be obtained. Since crystal growth of the ST film occurs on a heterogeneous substrate more easily than a BST film, a comparatively thin initial film in a perovskite state with good crystallizability can be formed.

Second, by using another heating unit, the substrate where the thin ST film is formed is heated by an infrared heating lamp to promote crystallization of the thin ST film, so that a film to be formed on the ST film can be crystallized easily.

Third, by using the MOCVD apparatus again, a BST film in which the amount of Ba is larger than that of Sr is formed on the ST film. The layer of this BST film containing the large amount of Ba supplies Ba to the underlying ST film in the subsequent annealing.

Fourth, a BST film containing Sr and Ba at a rate of 1:1 is formed on the BST film in which the amount of Ba is larger than that of Sr. In this thin film formation, because of the presence of the underlying ST film as a crystal film, the BST film is formed in the crystalline state.

Fifth, by using another heating unit, the substrate where the three films are formed is heated by the infrared heating lamp to promote crystallization of the formed BST film. Simultaneously, Ba is supplied to the lowermost thin ST film, so that the entire structure forms a BST film in the crystalline state which can be entirely used as a capacitor film.

With the above procedures, a BST film can be formed with good step coverage as well as good crystallization.

Conventionally, many steps are required, as described above. Consequently, the system increases in size to increase the cost of the apparatus to be used for thin film formation, leading to a high product unit cost.

SUMMARY OF THE INVENTION

The present invention is made in order to solve the problems described above, and has as its principal object to form a crystal film of a metal oxide, e.g., BST, on the surfaces of different types of materials that form steps, with good step coverage while suppressing the cost.

In order to achieve the above object, according to an aspect of the present invention, as the first step, an atmosphere is set to a first vacuum degree, and a gas of an organometallic compound and oxygen gas are introduced onto a surface of a base heated to a first temperature, to form a plurality of crystal nuclei, which are made of an oxide of a metal constituting the organometallic compound, on the surface of the base. Subsequently, as the second step, the atmosphere is set to a second vacuum degree lower in vacuum than in the first step, and the gas of the organometallic compound and the oxygen gas are introduced onto the surface of the base heated to a second temperature, to form a crystal thin film made of an oxide of the metal on the surface of the base. In the first step, the first vacuum degree is set to a vacuum degree at which the oxide of the metal is formed by crystal growth on surfaces of different materials, and the plurality of crystal nuclei are formed at a high density so that a crystal grain which is formed by a crystal nucleus upon growing comes into contact with a crystal grain growing from an adjacent crystal nucleus. In the second step, the second temperature is set to less than a temperature at which the oxide of the metal is formed by crystal growth on the surfaces of the different materials. In the above two steps, as the organometallic compound, an organic compound of strontium, an organic compound of barium, and an organic compound of titanium are used. Alternatively, as the organometallic compound, the organic compound of titanium and one of the organic compound of strontium and the organic compound of barium are used. In the first step, a gas of the organic compound of titanium, the oxygen gas and one of a gas of the organic compound of strontium and a gas of the organic compound of barium are introduced onto the surface of the base. In the second step, the gas of the organic compound of strontium, the gas of the organic compound of barium, the gas of the organic compound of titanium, and the oxygen gas are introduced onto the surface of the base.

According to the present invention, after the crystal nuclei are formed, a crystal film of a metal oxide such as BST is formed at a temperature providing good step coverage and falling within a temperature range where a metal oxide is not formed by crystal growth on surfaces of different materials.

According to another aspect of the present invention, as the pre-process, a surface of a base as a thin film forming target is exposed to a plasma. After that, as the first step, an atmosphere is set to a first vacuum degree, and a gas of an organometallic compound and oxygen gas are introduced onto the surface of the base heated to a first temperature, to form a plurality of crystal nuclei, which are made of an oxide of a metal constituting the organometallic compound, on the surface of the base. Subsequently, as the second step, the atmosphere is set to a second vacuum degree, and the gas of the organometallic compound and the oxygen gas are introduced onto the surface of the base heated to a second temperature, to form a film made of an oxide of the metal on the surface of the base. In the first step, the first vacuum degree is set to such a vacuum degree at which the oxide of the metal is formed by crystal growth on the surface of the base, which has been subjected to the pre-process, at the first temperature, and the plurality of crystal nuclei are formed at a high density so that a crystal grain which is formed by growing a crystal nucleus comes into contact with a crystal grain growing from an adjacent crystal nucleus. In the second step, the second temperature is set to less than a temperature at which the oxide of the metal is formed by crystal growth on surfaces of different materials. In the above process, as the organometallic compound, an organic compound of strontium, an organic compound of barium, and an organic compound of titanium are used. As the organometallic compound, the organic compound of titanium and one of the organic compound of strontium and the organic compound of barium are used. In the first step, a gas of the organic compound of titanium, the oxygen gas and one of a gas of the organic compound of strontium and a gas of the organic compound of barium are introduced onto the surface of the base. In the second step, the gas of the organic compound of strontium, the gas of the organic compound of barium, the gas of the organic compound of titanium, and the oxygen gas are introduced onto the surface of the base.

According to the present invention, after the crystal nuclei are formed, a crystal film of a metal oxide such as BST is formed at a temperature providing good step coverage and falling within a temperature range where a metal oxide is not formed by crystal growth on surfaces of different materials.

According to still another aspect of the present invention, as the first step, an atmosphere is set to a first vacuum degree, and a gas of an organometallic compound and oxygen gas are introduced onto a surface of the base heated to a first temperature, to form a plurality of crystal nuclei, which are made of an oxide of a metal constituting the organometallic compound, on the surface of the base. As the second step, the atmosphere is set to a second vacuum degree, and the gas of the organometallic compound and the oxygen gas are introduced onto the surface of the base heated to a second temperature, to form a film made of the oxide of the metal on the surface of the base. In the first step, the first temperature is set to a temperature at which the oxide of the metal is formed by crystal growth on surfaces of different materials, and the plurality of crystal nuclei are formed at a high density so that a crystal grain which is formed by growing a crystal nucleus upon comes into contact with a crystal grain growing from an adjacent crystal nucleus. In the second step, the second temperature is set to less than a temperature at which the oxide of the metal is formed by crystal growth on the surfaces of the different materials. In the above process, as the organometallic compound, an organic compound of strontium, an organic compound of barium, and an organic compound of titanium are used. As the organometallic compound, the organic compound of titanium and one of the organic compound of strontium and the organic compound of barium are used. In the first step, a gas of the organic compound of titanium, the oxygen gas and one of a gas of the organic compound of strontium and a gas of the organic compound of barium are introduced onto the surface of the base. In the second step, the gas of the organic compound of strontium, the gas of the organic compound of barium, the gas of the organic compound of titanium, and the oxygen gas are introduced onto the surface of the base.

According to the present invention, after the crystal nuclei are formed, a crystal film of a metal oxide such as BST is formed at a temperature providing good step coverage and falling within a temperature range where a metal oxide is not formed by crystal growth on surfaces of different materials.

Another aspect of the present invention comprises the first step of setting an atmosphere for a base as a thin film forming target to a predetermined vacuum degree, and introducing a gas of an organometallic compound, an oxidizing gas, and an inert gas onto a surface of the base heated to a first temperature, to form a plurality of crystal nuclei, which are made of an oxide of a metal constituting the organometallic compound, on the surface of the base, and the second step of setting the atmosphere for the base to a predetermined vacuum degree, and introducing the gas of the organometallic compound and the oxidizing gas onto the surface of the base heated to a second temperature, to form a film made of the oxide of the metal on the surface of the base. In the first step, a partial pressure of the organometallic compound on the base is set to a vacuum degree at which the oxide of the metal is formed by crystal growth on surfaces of different materials at the first temperature, and the plurality of crystal nuclei are formed at a high density so that a crystal grain which is formed by growing a crystal nucleus comes into contact with a crystal grain growing from an adjacent crystal nucleus. In the second step, the second temperature is set to less than a temperature at which the oxide of the metal is formed by crystal growth on the surfaces of the different materials.

According to the present invention, after the crystal nuclei are formed by decreasing the partial pressure of the organometallic compound on the base, a crystal film of a metal oxide such as BST is formed at a temperature providing good step coverage and falling within a temperature range where a metal oxide is not formed by crystal growth on surfaces of different materials.

BRIEF DESCRIPTION OF THE DRAWINGS

FIG. 5 is a graph showing the dielectric characteristics of BST films;

FIG. 6 is a flow chart showing a film formation process in the second embodiment;

DESCRIPTION OF THE PREFERRED EMBODIMENTS

The preferred embodiments of the present invention will be described in detail with reference to the accompanying drawings.

First Embodiment

The first embodiment of the present invention will be described. The first embodiment exemplifies formation of a BST film. In the first embodiment, a case will be described wherein the BST film is used as the capacitor film for the DRAM described above.

Figure 1:
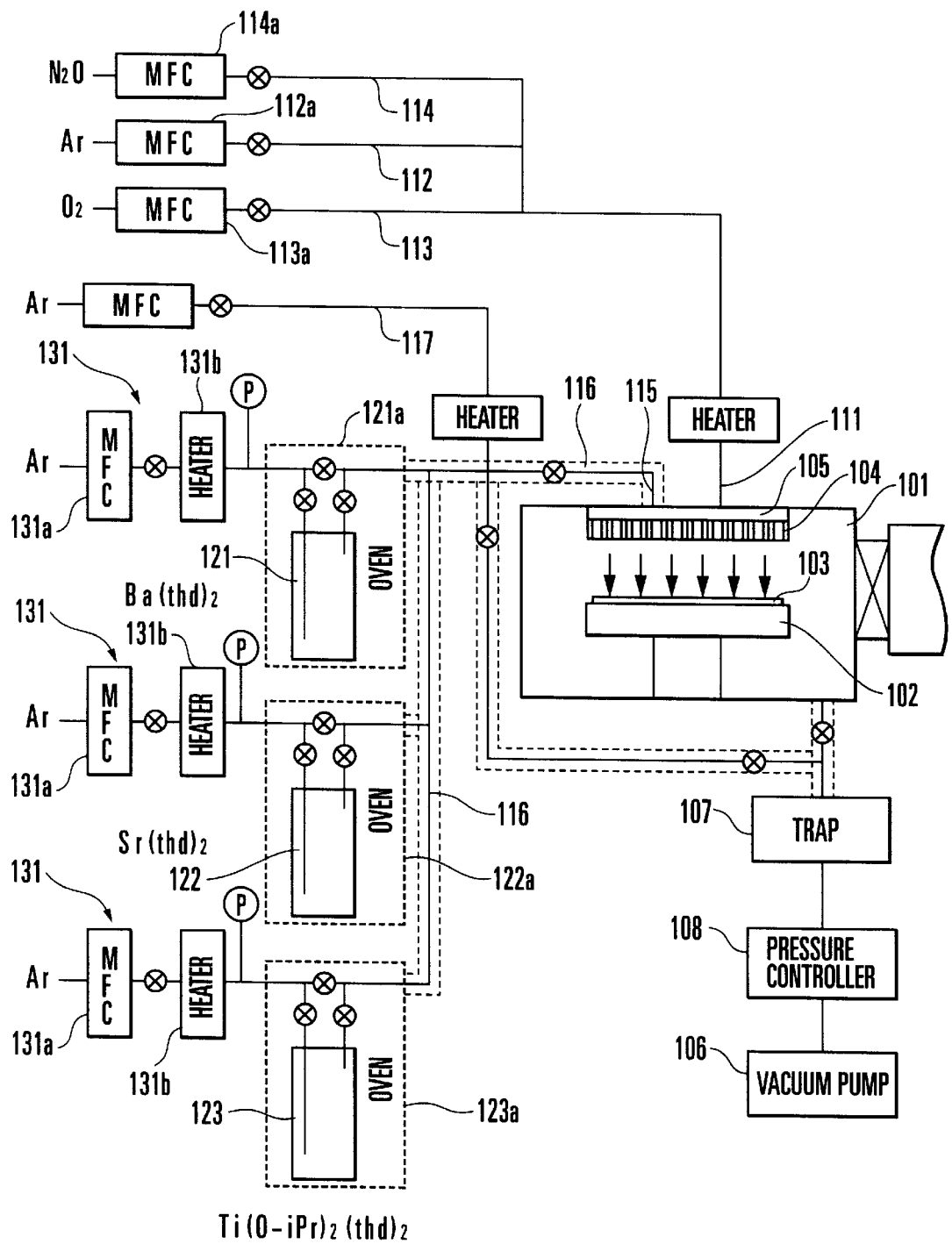
FIG. 1 is a view showing the schematic arrangement of a CVD apparatus used in the first embodiment of the present invention.

A CVD apparatus to be employed will be briefly described in order to explain the present invention. As shown in FIG. 1, a reaction chamber 101 is a hermetic vessel. A substrate stage 102 placed on a base is arranged in the reaction chamber 101, and a wafer 103 can be placed on the substrate stage 102. Although not shown in FIG. 1, the wall of the reaction chamber 101 can be heated by a heating means arranged around the reaction chamber 101 up to 250° C. The substrate stage 102 has a built-in heater for heating the wafer 103 from below. Although not shown, in order to generate a plasma in the reaction chamber 101, an electrode connected to RF power supply is also arranged on the substrate stage 102 to supply RE power to the reaction chamber 101.

A diffusion plate 104 is arranged on the upper surface in the reaction chamber 101 to oppose the substrate stage 102. A source gas is supplied as it is diffused by the diffusion plate 104 toward the substrate stage 102. A mixer 105 is arranged on the rear surface of the diffusion plate 104. Gases to be introduced into the reaction chamber 101 are mixed by the mixer 105, and the gas mixture is supplied to the diffusion plate 104. An organometallic compound source and an oxidizing gas may be supplied from separate shower heads (Post-Mix scheme).

The interior of the reaction chamber 101 is evacuated by a vacuum pump 106, and an exhaust line extending from the reaction chamber 101 to vacuum pump 106 has a trap 107 and pressure controller 108. The trap 107 removes, from the exhaust line to which the trap 107 is connected, that material in an exhaust gas which is liquid in room temperature. The pressure controller 108 adjusts the exhaust amount of the vacuum pump 106, thereby controlling the vacuum degree in the reaction chamber 101. The maximum target vacuum degree is determined by the exhaust ability of the vacuum pump 106.

How to supply the respective gases to be introduced to the reaction chamber 101 w ill be described.

The reaction chamber 101 is connected to an Ar gas line 112, $O_2$ gas line 113, and $N_2O$ gas line 114 through a gas supply portion 111, and Ar gas, $O_2$ gas, and $N_2O$ gas are introduced into the reaction chamber 101 through the gas lines 112, 113, and 114, respectively. Microflow controllers (MFCs) 112a, 113a, and 114a for controlling the flow rates of the supply gases are provided midway along the respective gas lines 112, 113, and 114, to control the supply amounts of the gases to be supplied into the reaction chamber 101. $O_2$ and $N_2O$ are gases for forming oxides. Ar gas is used for dilution and to generate a plasma.

The reaction chamber 101 is also connected to an evaporated gas line 116, which is heated to, e.g., about 200° C. to 250° C., through a gas supply portion 115. The evaporated gas line 116 is connected to an Ar gas line 117 to which Ar gas is to be introduced, and source gas supply units 121, 122, and 123 for supplying gases of organometallic compounds as materials that form a thin film. The source gas supply units 121 to 123 are respectively arranged in ovens 121a, 122a, and 123a so that they are heated. Thus, solid samples stored in the source gas supply units 121 to 123 can be sublimated.

The source gas supply units 121 to 123 are connected to Ar gas lines 131. The supply amounts of pressurized Ar gas are controlled by MFCs 131a, and the supply amount-controlled Ar gas is heated by heaters 131b and supplied to the corresponding ovens as a back pressure. Hence, the source gases of the thin film forming materials generated by sublimation with the source gas supply units 121 to 123 are fed to the evaporated gas line 116. The source gases fed to the evaporated gas line 116 are introduced into the reaction chamber 101 through the gas supply portion 115. As the source gases obtained by sublimation of the organometallic compounds pass through the respective gas lines, if the temperature drops, the sublimated organometallic compounds solidify quickly to clog the gas lines. However, since the evaporated gas line 116 is heated to about 200° C. to 250° C., the organometallic compounds are introduced in the reaction chamber 101 while maintaining the gaseous state.

The source gas supply unit 121 is filled with a solid sample of $Ba(thd)_2$. Solid $Ba(thd)_2$ is heated by the oven 121a to sublimate, thereby generating $Ba(thd)_2$ gas. The source gas supply unit 122 is filled with a solid sample of $Sr(thd)_2$. Solid $Sr(thd)_2$ is heated by the oven 122a to sublimate, thereby generating $Sr(thd)_2$ gas. The source gas supply unit 123 is filled with a solid sample of $Ti(O—iPr)_2(thd)_2$. Solid $Ti(O—iPr)_2(thd)_2$ is heated by the oven 123a to sublimate, thereby generating $Ti(O—iPr)_2(thd)_2$ gas.

A method of forming a BST thin film according to the present invention by using the CVD apparatus shown in FIG. 1 will be described. The following description will start from a state wherein storage nodes of a DRAM are formed.

Figure 2A:
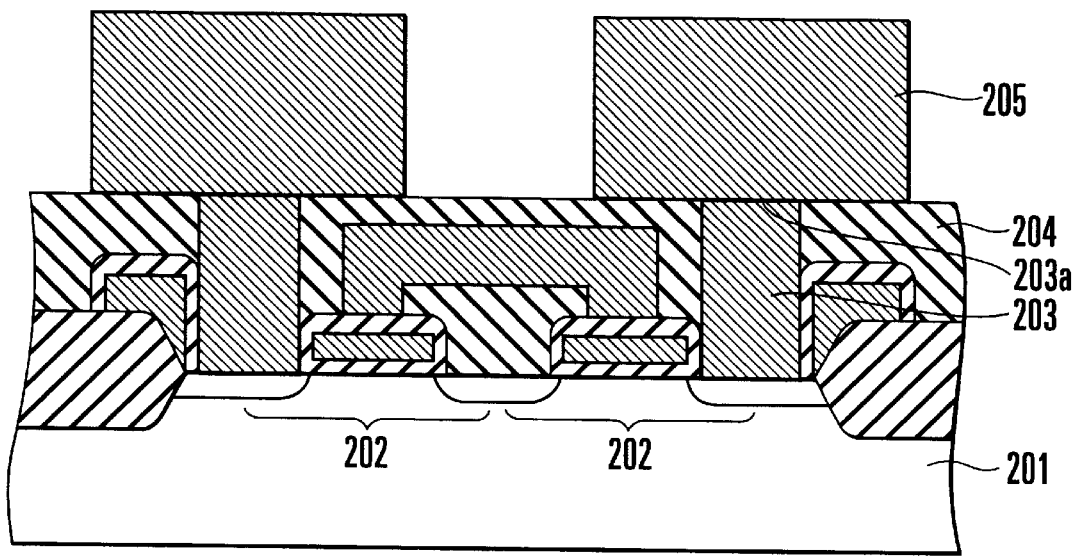
FIGS. 2A to 2E are views for explaining a thin film forming method according to an embodiment of the present invention by way of formation of a capacitor film for a DRAM.

First, as shown in FIG. 2A, a substrate 201, on which storage nodes 205 connected to transistors 202 through plugs 203 are formed, is prepared. The storage nodes 205 are formed on an interlevel insulating film 204 formed to cover the transistors 202. The interlevel insulating film 204 is formed by depositing, e.g., silicon dioxide by CVD. Impurity-doped conductive polysilicon is filled in contact holes formed in the interlevel insulating film 204, thereby forming the plugs 203.

The storage nodes 205 are formed to be connected to the plugs 203 through barrier films 203a which are formed for suppressing mutual diffusion of materials. The storage nodes 205 are made of, e.g., Pt. For example, the plugs 203 are formed to have the barrier films 203a on their surfaces, and after that a Pt film is formed on the interlevel insulating film 204 by sputtering or the like. The Pt film is patterned by known photolithography and etching, thereby forming the storage nodes 205.

Figure 2B:
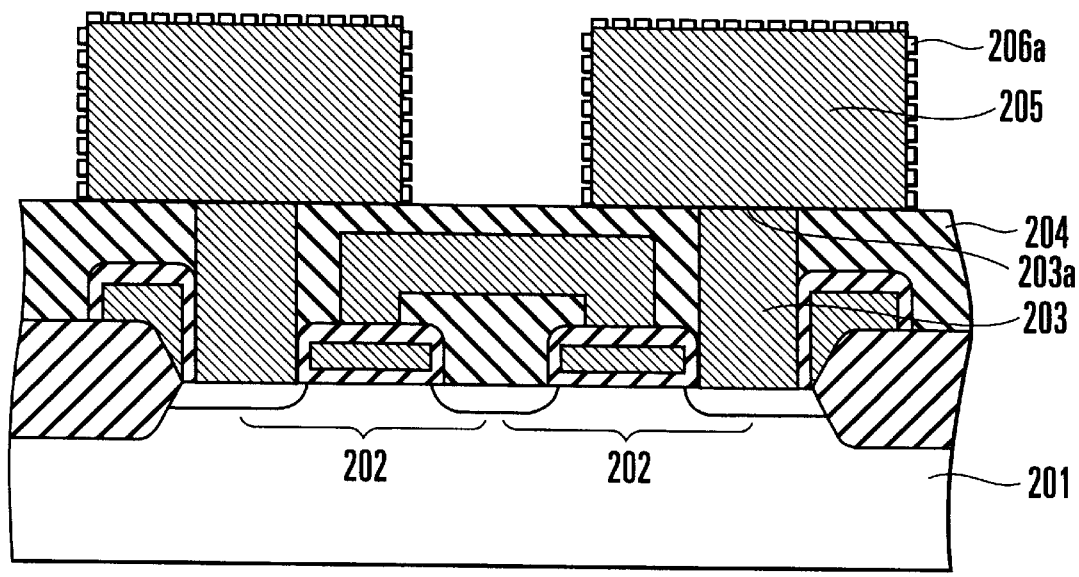

After the substrate 201 having the storage nodes 205 in the above manner is prepared, it is placed as a processing target wafer 103 on the substrate stage 102 of the CVD apparatus shown in FIG. 1. The interior of the reaction chamber 101 in which the wafer 103 is arranged is set at a high vacuum of, e.g., $10^{-2}$ Torr or less, and $O_2$ gas and $N_sO$ gas are supplied into the reaction chamber 101 together with Ti, Ba, and Sr source gases, to enable BST deposition. In BST deposition, the heating mechanism of the substrate stage 102 is controlled so that the temperature of the wafer 103 as the processing target becomes about 450° C. As the result of this temperature control, crystal nuclei 206a of BST are formed at least on the surfaces of the storage nodes 205, as shown in FIG. 2B. The substrate temperature during formation of the crystal nuclei is not limited to 450° C., and suffices as far as it is equal to or higher than a temperature at which crystal nuclei can be formed in the high-vacuum state described above. For example, the substrate temperature can be as high as 500° C. or more. The higher the temperature, the more formation of the crystal nuclei 206a is promoted.

Figure 2C:
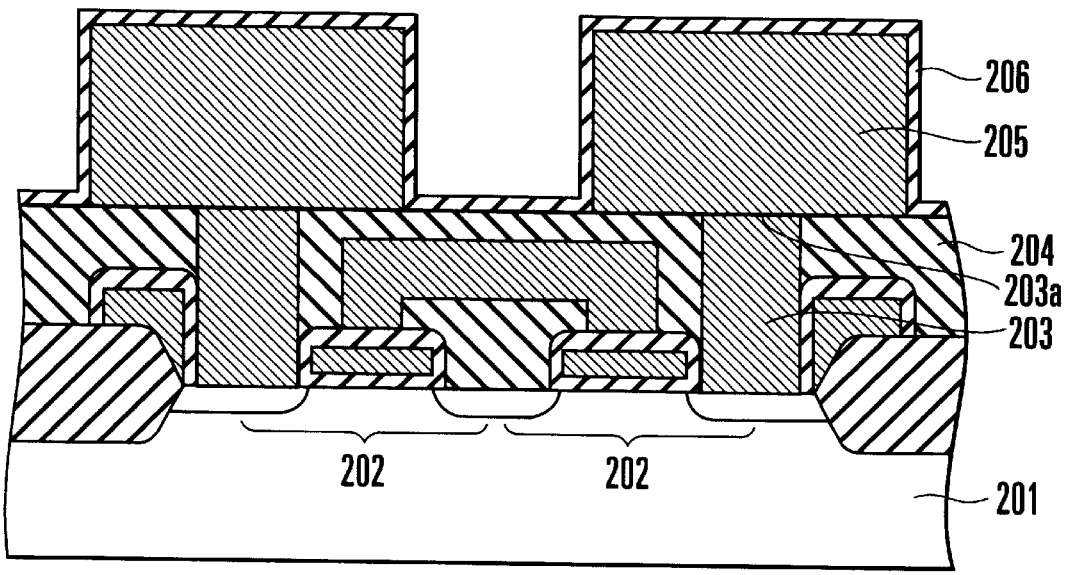

Subsequently, while $O_2$ gas and $N_sO$ gas are continuously supplied together with the Ti, Ba, and Sr source gases to enable BST deposition, the reaction chamber 101 is set to a low vacuum state of about 0.1 Torr to several Torr to increase the supply amounts of the Ti, Ba, and Sr source gases. In this case as well, the heating mechanism of the substrate stage 102 is controlled so that the temperature of the wafer 103 as the processing target becomes about 450° C. The substrate temperature in the low-vacuum state is not limited to 450° C. The substrate temperature suffices as far as it is lower than a temperature at which crystal growth occurs on the heterointerface and the desired step coverage and desired thin film forming rate can be obtained. Hence, the crystal nuclei 206a grow large, as shown in FIG. 2C, to consequently form a capacitor film 206 made of BST in the crystalline state.

From the foregoing, the capacitor film 206 made of BST in the crystalline state (polycrystalline state) is formed to cover the storage nodes 205.

Figure 2D:
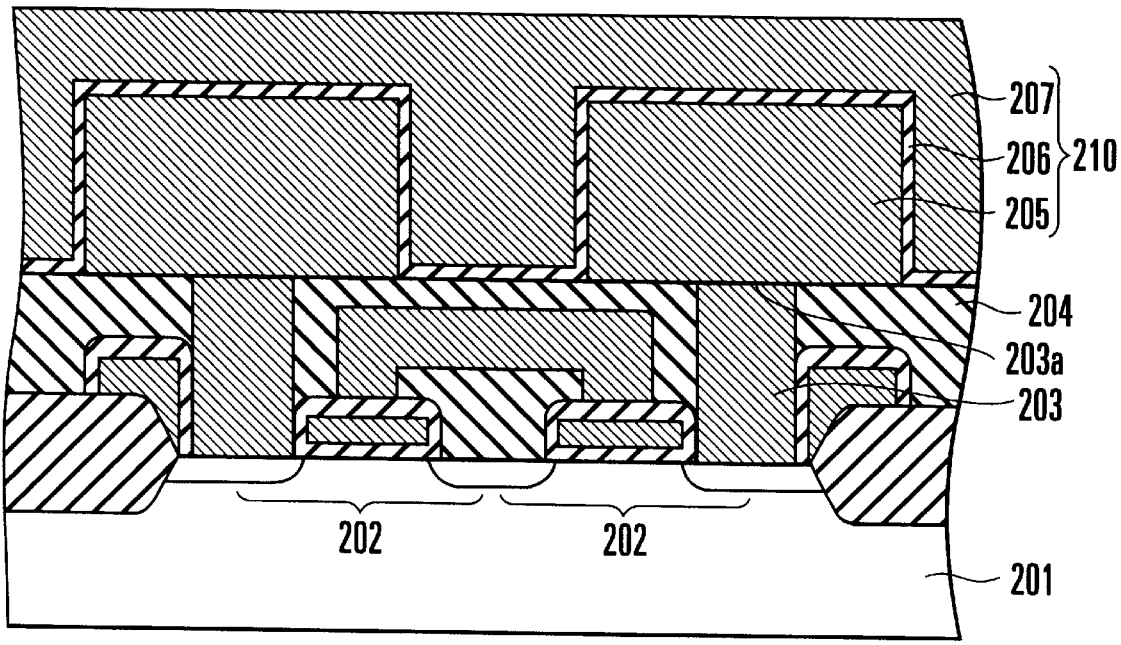

Subsequently, as shown in FIG. 2D, a cell plate 207 is formed on the capacitor film 206, thereby forming a capacitor 210 to be connected to the transistor 202.

Figure 2E:
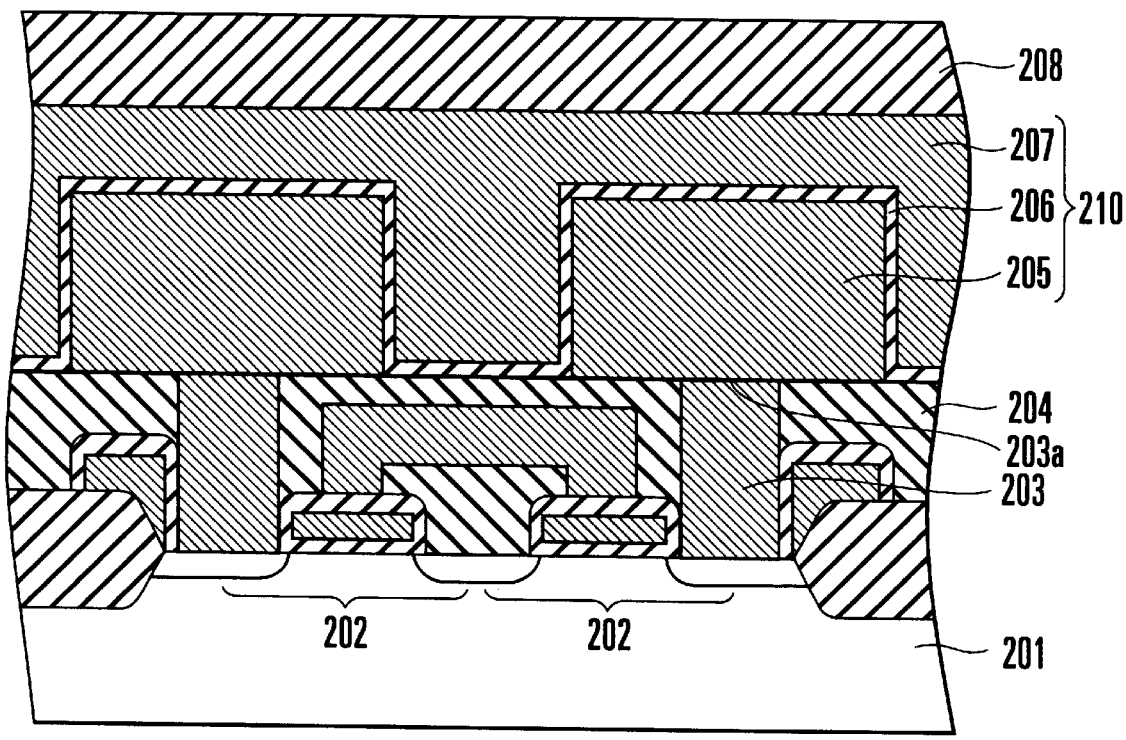

After the capacitor 210 is formed, an interlevel insulating film 208 is formed on the cell plate 207, as shown in FIG. 2E. Interconnections such as a bit line are formed on the interlevel insulating film 208, so that a DRAM, in which the capacitor film 206 made of BST with a high dielectric constant is formed on the storage node 205 with good step coverage, can be obtained.

Formation of crystal nuclei described in FIG. 2B will be described in more detail.

According to MOCVD for forming a capacitor film made of BST described above, an energy such as heat is applied to a thin film forming material to be supplied as a gas onto a substrate surface, so that gas molecules are excited and decomposed to form an intermediate product (precursor). The intermediate product is then adsorbed, diffused, reacted, and dissociated on the substrate surface to form a thin film on the substrate.

When the atmosphere for the substrate on which a thin film is to be formed is set at a higher vacuum, the concentration of the supplied source gas becomes low and the density of the precursor molecules also becomes low, so that surface diffusion of the molecules tends to occur more likely than collision of the molecules. In this manner, if the precursor molecules adsorbed by the surface of the substrate as the film forming target can be sufficiently diffused on the substrate surface, crystal nuclei, which is in the most stable state in terms of thermodynamics, can be formed easily. Accordingly, if the substrate atmosphere is set at the high-vacuum state as described above so the precursor molecules can be sufficiently diffused on the substrate surface, crystal nuclei can be formed easily even on surfaces of different types of materials.

At the initial stage of growth, if crystal nuclei are formed on the substrate surface, it is assumed that the precursors supplied to the substrate surface from the gas phase will be sequentially deposited on the generated crystal nuclei as the origin to grow to crystal grains. Even in a low-temperature range or at a low-vacuum degree where crystals do not usually grow on the surfaces of different types of materials, as far as the crystal nuclei are present, they grow to crystals, so that the crystal structure can be sustained.

If crystal nuclei can be formed at a high density of, e.g., $10^{15}$ cm$^{-2}$ or more on the substrate surface at the initial stage of growth, as the generated crystal nuclei grow to a certain degree, they are linked to each other to form a continuous crystal film. It is supposed that new crystal nuclei are formed on the surface of the continuous film to form a random polycrystalline film.

Therefore, when a thin BST film is to be formed at about 450° C. by MOCVD as well, if many crystal nuclei are formed on the substrate surface at the initial stage of thin film formation, they can form a crystal film. A whole area of the film which is formed after generating the crystal nuclei can be crystallized, so that a flat crystal film can be supposed to be obtained. If the whole film is in the crystalline state, the film has no portion where the growth rate is locally high, and generation of a product, which is formed when crystal grains are partially generated, can be suppressed.

Figure 3:
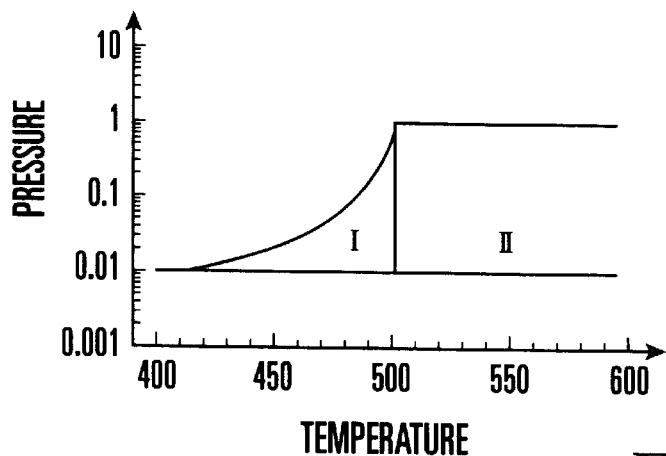
FIG. 3 is a graph showing the relationship between formation of crystal nuclei, temperature, and pressure.

According to the first embodiment, as described above, at the initial stage of thin film formation by MOCVD, the vacuum degree of the atmosphere for the substrate as the thin film forming target is set high, and high-density crystal nuclei are formed on the surface of the substrate as the thin film forming target. When, however, thin film formation by MOCVD is continued at a high vacuum state, although crystal growth is sustained, the amounts of source gases that can be supplied for thin film formation cannot be increased if the vacuum degree stays high. Consequently, if the vacuum degree stays high, the thin film forming rate is very low, and the productivity decreases to increase the process cost, which is not practical. Regarding this, if crystal nuclei already exist as described above, even if the vacuum degree is decreased to increase the supply amounts of source gases, a crystal film can be formed. Thus, after crystal nuclei are formed at a desired density, the vacuum degree is set to such a value that a desired thin film forming rate can be obtained, and thin film formation is performed. After the crystal nuclei are formed at the desired density, the substrate temperature is set to a value or less at which crystal growth occurs on the surfaces of different types of materials while providing a desired step coverage. The region with a temperature and pressure that allow crystal nuclei formation described above corresponds to region I in FIG. 3. As shown in region II of FIG. 3, even when the pressure is high, if the temperature is as high as 500° C. or more, crystal growth takes place.

Figure 4:
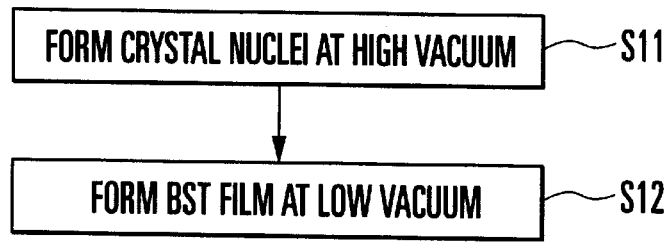
FIG. 4 is a flow chart showing a film formation process in the first embodiment.

In fine, in the first embodiment, as shown in FIG. 4, first, in step S11, the atmosphere is set to a higher vacuum of $10^{-2}$ Torr or less, and the source gases are supplied to enable BST deposition. BST crystal nuclei are formed at a desired density on the region of a substrate where BST is to be formed. In step S12, the atmosphere is set to about 0.1 Torr to several Torr, which is the vacuum degree for thin film formation by ordinary MOCVD, and the source gases are supplied to enable BST deposition. The substrate temperature is set to lower than a temperature at which crystal growth occurs on the surfaces of different types of materials and a thin film can be formed with good step coverage. A BST film is allowed to grow in this manner.

As a result, according to the first embodiment described above, a BST crystal film can be formed with good step coverage. According to the first embodiment, since a process of forming crystal nuclei is merely added, the number of steps does not increase. Since the process of forming crystal nuclei is merely added, it suffices if a CVD apparatus with a reaction chamber that can be evacuated and can heat a substrate is used, and the system size does not increase.

FIG. 5 shows the result of comparison in dielectric constant and dielectric loss between the BST film formed according to the first embodiment and a BST film formed without forming crystal nuclei. In FIG. 5, black dots indicate changes in dielectric constants at respective bias voltages of the BST film (BST1) according to the first embodiment, and square bullets indicate changes in dielectric constants at the respective bias voltages of the BST film (BST2) formed without forming crystal nuclei. x indicate changes in dielectric losses at the respective bias voltages of the BST film (BST1) according to the first embodiment, and black triangles indicate changes in dielectric losses at the respective bias voltages of the BST film (BST2) formed without forming crystal nuclei. As is apparent from FIG. 5, the BST film according to the first embodiment has a higher dielectric constant than other BST films.

Second Embodiment

The second embodiment of the present invention will be described. The second embodiment also exemplifies formation of a BST film. In the following description, the present invention will be described by way of a case wherein the BST film is used as the capacitor film of the DRAM described above. The second embodiment uses a CVD apparatus shown in FIG. 1, in the same manner as in the first embodiment. In the second embodiment, a thin film forming method will be described with reference to FIGS. 2A to 2E. Hence, the second embodiment is identical to the first embodiment for FIGS. 1 to 2A and FIGS. 2C to 2E.

First, as shown in FIG. 2A, a substrate 201, on which storage nodes 205 connected to transistors 202 through plugs 203 are formed, is prepared. The storage nodes 205 are formed on an interlevel insulating film 204 formed to cover the transistors 202. The interlevel insulating film 204 is formed by depositing, e.g., silicon dioxide by CVD. Impurity-doped conductive polysilicon is filled in contact holes formed in the interlevel insulating film 204, thereby forming the plugs 203.

The storage nodes 205 are formed to be connected to the plugs 203 through barrier films 203a which are formed for suppressing mutual diffusion of materials. The storage nodes 205 are made of, e.g., Pt. For example, the plugs 203 are formed to have the barrier films 203a on their surfaces, and after that a Pt film is formed on the interlevel insulating film 204 by sputtering or the like. The Pt film is patterned by known photolithography and etching, thereby forming the storage nodes 205.

After the substrate 201 having the storage nodes 205 is prepared in the above manner, it is placed as a processing target wafer 103 on the substrate stage 102 of the CVD apparatus shown in FIG. 1. The interior of the reaction chamber 101 is set at a high vacuum of, e.g., $10^{-2}$ Torr, and $A_2$ gas is supplied into the reaction chamber 101. For the plasma process, other than Ar gas, an inert gas such as helium, or hydrogen gas may be used. In the second embodiment, RF is applied to an electrode (not shown) incorporated in the substrate stage 102, in order to supply RF power to the reaction chamber 101, thereby generating a plasma. The surface of the substrate 201 shown in FIG. 2A is exposed to the generated plasma for a predetermined period of time, so that at least the surfaces of the storage nodes 205 of the substrate 201 are exposed to the plasma.

Supply of the RF power is stopped, and simultaneously supply of Ar gas is stopped, to stop generation of the plasma. The operating states of the vacuum pump 106 and pressure controller 108 are changed to set the vacuum degree in the reaction chamber 101 to, e.g., 0.1 Torr to several Torr, so that Ti, Ba, and Sr source gases and $O_2$ and $N_2$ are supplied to enable BST deposition. As a result, crystal nuclei 206a of BST are formed at least on the surfaces of the storage nodes 205, as shown in FIG. 2B. The substrate temperature during formation of the crystal nuclei is not limited to 450° C., and suffices as far as it is equal to or higher than a temperature at which crystal nuclei can be formed after the plasma process described above. For example, the substrate temperature can be as high as 500° C. or more. The higher the temperature, the more easily the crystal nuclei 206a can be formed. Alternatively, the reaction chamber 101 may be set to a high vacuum degree of, e.g., $10^{-2}$ Torr or less, and after that the respective source gases may be supplied. Then, crystal nuclei can be formed more easily.

Subsequently, while the temperature of the wafer 103 as the processing target is at about 450° C., the gases described above are continuously supplied, to sustain a state wherein BST deposition is enabled. The substrate temperature at this stage is not limited to 450° C., but suffices as far as it is lower than a temperature at which crystal growth occurs on surfaces of different types of materials and the desired step coverage and desired thin film forming rate can be obtained. Hence, the crystal nuclei 206a grow large to consequently form a capacitor film 206 made of BST in the crystalline state, as shown in FIG. 2C.

From the foregoing, the capacitor film 206 made of BST in the crystalline state (polycrystalline state) is formed to cover the storage node 205.

Subsequently, as shown in FIG. 2D, a cell plate 207 is formed on the capacitor film 206, thereby forming a capacitor 210 to be connected to the transistor 202. After that, an interlevel insulating film 208 is formed on the cell plate 207, as shown in FIG. 2E. Interconnections such as a bit line are formed on the interlevel insulating film 208, thereby forming a DRAM.

As described above, according to the second embodiment, prior to formation of the BST film by MOCVD, the surface of the substrate as the thin film forming target is exposed to the plasma. After the pre-process of exposing the substrate surface to the plasma, a thin BST film is formed in the ordinary manner.

As described above, at the initial stage of growth, if crystal nuclei are formed on the substrate surface, precursors to be supplied to the substrate surface from the gas phase will be sequentially deposited on the nuclei as the origin to grow to crystal grains. Even in a low-temperature range or at a low-vacuum degree where crystals do not usually grow, as far as the crystal nuclei are present, they grow to crystals, so that the crystal structure can be sustained.

In the second embodiment, as shown in FIG. 6, in step S21, the substrate surface is exposed to the plasma prior to thin film formation, and in step S22, thin film formation is started, so that BST crystal nuclei can be formed at a high density on the surface of the substrate at the initial stage of growth. In step S23, while the crystal nuclei are formed at a high density, a thin BST film is formed by MOCVD in the conventional manner.

As a result, in the second embodiment, a BST crystal film can be formed with good step coverage, in the same manner as in the first embodiment described above. In the second embodiment, since a process of generating a plasma and exposing the substrate to it is merely added, the number of steps does not increase. Since the added process is only that for generating the plasma, it suffices if a CVD apparatus with a reaction chamber that can be evacuated and can generate a plasma is used, and the system size does not increase.

In the second embodiment described above, after the plasma process is performed, a BST film is formed by ordinary MOCVD. However, the present invention is not limited to this. After the plasma process is performed, the process of the first embodiment described above may be performed. More specifically, after the plasma process is performed, for example, the source gases may be supplied at a high vacuum of $10^{-2}$ Torr or less to enable BST deposition, so that BST crystal nuclei are formed at a high density. This facilitates generation of BST crystal nuclei.

Third Embodiment

The third embodiment of the present invention will be described. The third embodiment also exemplifies formation of a BST film. In the following description, the present invention will be described by way of a case wherein the BST film is used as the capacitor film of the DRAM described above.

Figure 7:
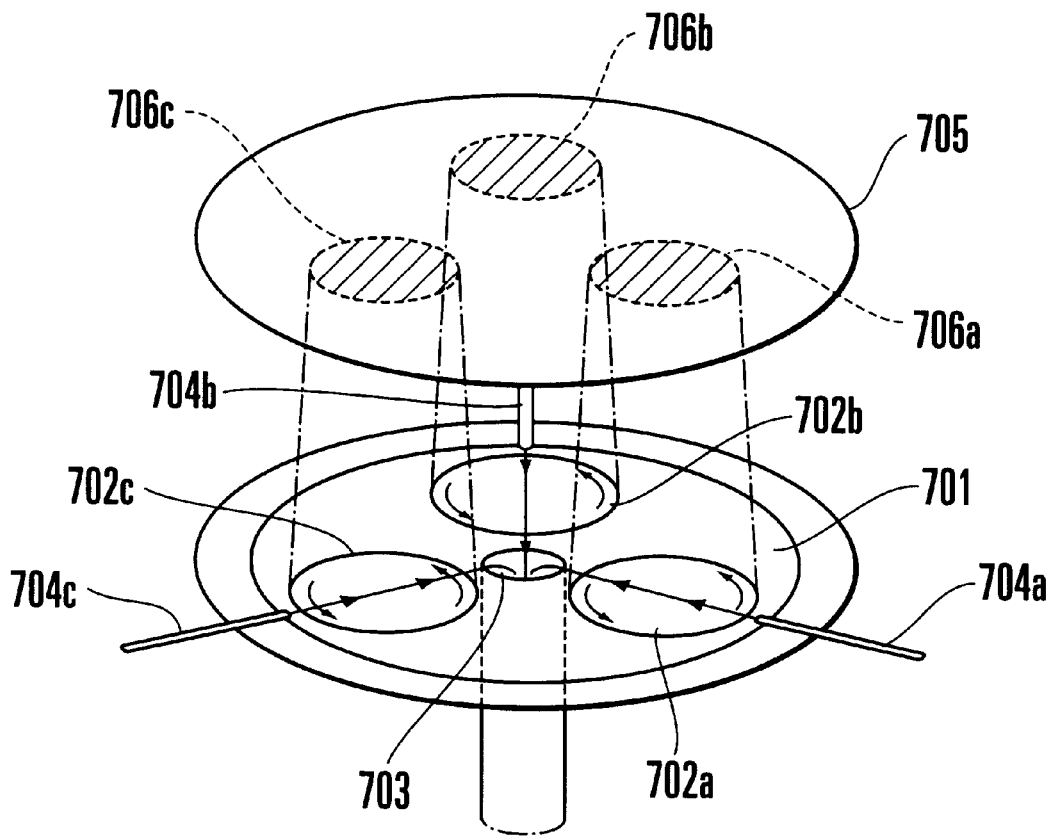
FIG. 7 is a view showing schematic partial arrangement of a CVD apparatus used in the third embodiment of the present invention.

The third embodiment uses a CVD apparatus shown in FIG. 7. FIG. 7 shows part of the interior of a reaction chamber of the CVD apparatus which performs thin film formation. In the reaction chamber of this CVD apparatus, a bottom surface 701 of the reaction chamber has three substrate stages 702a, 702b, and 702c which are rotatable. An exhaust port 703 communicating with an exhaust portion (not shown) is formed at the central portion of the bottom surface 701 of the reaction chamber. The substrate stages 702a, 702b, and 702c respectively have source gas inlet portions 704a, 704b, and 704c around them. An upper surface 705 of the reaction chamber which opposes the bottom surface 701 has infrared lamps 706a, 706b, and 706c.

In the CVD apparatus with the above arrangement, for example, the infrared lamp 706a opposes the substrate stage 702a. Infrared rays from the infrared lamp 706a can heat the surface of a substrate placed on the substrate stage 702a.

The interior of the reaction chamber defined by the bottom surface 701, upper surface 705, and the like is evacuated through the exhaust port 703. For example, a source gas introduced from the source gas inlet portion 704a passes above the substrate stage 702a and is exhausted through the exhaust port 703.

Therefore, for example, the surface of the substrate placed on the substrate stage 702a is heated with the infrared rays from the infrared lamp 706a. When the source gas is supplied onto the heated substrate, a thin film is formed on the substrate by CVD. Since the substrate stage 702a is rotatable, the source gas is supplied onto the surface of the rotating substrate. As a result, a thin film can be uniformly formed on the substrate surface.

The substrate is heated as it is irradiated with infrared rays from its upper surface. In other words, according to this CVD apparatus, the upper surface of the thin film formed by CVD is heated directly.

How to form the capacitor film of the DRAM according to the third embodiment will be described. A description starts particularly from a state wherein the storage nodes of the DRAM are formed. The third embodiment also exemplifies formation of a BST film. In the following description as well, a case wherein the BST film is used as the capacitor film of the DRAM described above will be described. In the third embodiment, a thin film forming method will be described with reference to FIGS. 2A to 2E. Hence, the third embodiment is identical to the first embodiment for FIGS. 1 to 2A and for FIGS. 2C to 2E. Note that the third embodiment uses a CVD apparatus with the reaction chamber shown in FIG. 7.

First, as shown in FIG. 2A, a substrate 201, on which storage nodes 205 connected to transistors 202 through plugs 203 are formed, is prepared. The storage nodes 205 are formed on an interlevel insulating film 204 formed to cover the transistors 202. The interlevel insulating film 204 is formed by depositing, e.g., silicon dioxide by CVD. Impurity-doped conductive polysilicon is filled in contact holes formed in the interlevel insulating film 204, thereby forming the plugs 203.

The storage nodes 205 are formed to be connected to the plugs 203 through barrier films 203a which are formed for suppressing mutual diffusion of materials. The storage nodes 205 are made of, e.g., Pt. For example, the plugs 203 are formed to have the barrier films 203a on their surfaces, and after that a Pt film is formed on the interlevel insulating film 204 by sputtering or the like. The Pt film is patterned by known photolithography and etching, thereby forming the storage nodes 205.

After substrates 201 each having the storage nodes 205 are prepared in the above manner, they are placed as processing target wafers on the substrate stages 702a, 702b, and 702c of the CVD apparatus shown in FIG. 7. The interior of the reaction chamber where the substrates are introduced is set at a high vacuum of, e.g., $10^{-2}$ Torr or less, and $O_2$ and $N_2$ are supplied together with Ti, Ba, and Sr source gases onto the respective wafers through the source gas inlet portions 704a, 704b, and 704c to enable BST deposition. At this time, as the infrared lamps 706a, 706b, and 706c irradiate the wafers, the temperatures of the surfaces of the processing target wafers on the substrate stages 702a, 702b, and 702c are heated to instantaneously 500° C. or more.

As a result, crystal nuclei 206a of BST are formed at least on the surfaces of the storage nodes 205, as shown in FIG. 2B. The temperature of 500° C. mentioned above is a temperature at which BST crystals grow on the surfaces of different types of materials in MOCVD. Note that at this stage, the atmosphere need not be set to the high vacuum as described above, but may be a lower vacuum degree of, e.g., 0.1 Torr to several Torr within a range where nuclei formation takes place when the temperature is increased. If the atmosphere is set to a high vacuum of $10^{-2}$ Torr or less and then the source gases are introduced, this is identical to the first embodiment described above. In this case, the surfaces of the processing target wafers may be heated to a low temperature of about 450° C. upon being irradiated with infrared rays from the infrared lamps 706a, 706b, and 706c.

Subsequently, irradiation outputs of the infrared rays from the infrared lamps 706a, 706b, and 706c are decreased, so that the temperatures of the surfaces of the processing target wafers become about 450° C. The source gases described above are continuously supplied to sustain a state wherein BST deposition is enabled. The substrate temperature at this stage is not limited to 450° C., but suffices as far as it is lower than. a temperature at which crystal growth occurs on surfaces of different types of materials and the desired step coverage and desired thin film forming rate can be obtained. Hence, the crystal nuclei 206a grow large to consequently form a capacitor film 206 made of BST in the crystalline state, as shown in FIG. 2C.

From the foregoing, the capacitor film 206 made of BST in the crystalline state (polycrystalline state) is formed to cover the storage node 205.

Subsequently, as shown in FIG. 2D, a cell plate 207 is formed on the capacitor film 206, thereby forming a capacitor 210 to be connected to the transistor 202. After that, an interlevel insulating film 208 is formed on the cell plate 207, as shown in FIG. 2E. Interconnections such as a bit line are formed on the interlevel insulating film 208, so that a DRAM, in which the capacitor film 206 made of BST with a high dielectric constant is formed on the storage node 205 with good step coverage, can be obtained.

As described above, according to the third embodiment, at the early stage of formation of the BST film by MOCVD, the surface of the substrate as the thin film forming target is heated to a high temperature of 500° C. or more instantaneously by using the infrared lamp, to enable crystal film growth. After that, the temperature of the substrate surface is decreased, so that a thin BST film is formed in the ordinary manner.

As described above in the first and second embodiments, in the initial stage of growth, if crystal nuclei are formed on the substrate surface, precursors to be supplied to the substrate surface from the gas phase will be sequentially deposited on the nuclei as the origin, to grow to crystal grains. Even in a low-temperature range or at a low-vacuum degree where crystals do not usually grow, as far as the crystal nuclei are present, they grow to crystals, so that the crystal structure can be sustained.

Figure 8:
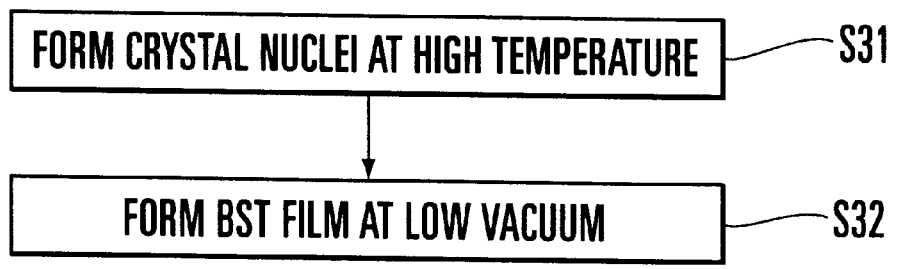
FIG. 8 is a flow chart showing a film formation process in the third embodiment.

In the third embodiment, as shown in FIG. 8, in step S31, the infrared lamps are used to heat, at the initial stage of thin film formation, the substrate surface to a temperature at which crystals grow. Hence, BST crystal nuclei can be formed at a high density on the surface of the substrate in the initial stage of growth. In step S32, while the crystal nuclei are formed at a high density, a thin BST film is formed by MOCVD in the conventional manner.

As a result, in the third embodiment as well, a BST crystal film can be formed with good step coverage, in the same manner as in the first and second embodiments described above. In the third embodiment, since a process of heating the substrate to a crystal growth temperature or more is added at the initial stage of thin film formation, the number of steps does not increase. Since only an infrared ray irradiating means are added to the CVD apparatus, the system size does not increase.

Fourth Embodiment

The fourth embodiment of the present invention will be described. The fourth embodiment also exemplifies formation of a BST film. In the following description, the present invention will be described by way of a case wherein the BST film is used as the capacitor film of the DRAM described above. In the fourth embodiment, the CVD apparatus shown in FIG. 1 is used, in the same manner as in the first embodiment. In the fourth embodiment, a thin film forming method will be described with reference to FIGS. 2A to 2E. Hence, the fourth embodiment is identical to the first embodiment regarding FIGS. 1 to 2A and FIGS. 2C to 2E.

First, as shown in FIG. 2A, a substrate 201, on which storage nodes 205 connected to transistors 202 through plugs 203 are formed, is prepared. The storage nodes 205 are formed on an interlevel insulating film 204 formed to cover the transistors 202. The interlevel insulating film 204 is formed by depositing, e.g., silicon dioxide by CVD. Impurity-doped conductive polysilicon is filled in contact holes formed in the interlevel insulating film 204, thereby forming the plugs 203.

The storage nodes 205 are formed to be connected to the plugs 203 through barrier films 203a which are formed for suppressing mutual diffusion of materials. The storage nodes 205 are made of, e.g., Pt. For example, the plugs 203 are formed to have the barrier films 203a on their surfaces, and after that a Pt film is formed on the interlevel insulating film 204 by sputtering or the like. The Pt film is patterned by known photolithography and etching, thereby forming the storage nodes 205.

After the substrate 201 having storage nodes 205 in the above manner is prepared, it is placed as a processing target wafer 103 on the substrate stage 102 of the CVD apparatus shown in FIG. 1. $O_2$ gas and $N_2$ gas are supplied together with Ti, Ba, and Sr source gases into the reaction chamber 101. At this time, in the fourth embodiment, the supply amounts of the Ti, Ba, and Sr source gases and the supply amounts of the $O_2$ gas and $N_2$ gas are set equal to those in the first embodiment, and an inert gas such as argon gas is introduced simultaneously, so that the interior of the reaction chamber 101 in which the wafer 103 is arranged is set to a vacuum degree of, e.g., about $10^{-1}$ Torr. Namely, since argon gas is additionally supplied, the vacuum degree in the reaction chamber is decreased without increasing the supply amounts of the respective gases. At this time, the heating mechanism of the substrate stage 102 is controlled so that the temperature of the wafer 103 as the processing target becomes about 450° C. As the result of this temperature control, crystal nuclei 206a of BST are formed at least on the surfaces of the storage nodes 205, as shown in FIG. 2B. The substrate temperature during formation of the crystal nuclei is not limited to 450° C., and suffices as far as it is equal to or higher than a temperature at which crystal nuclei can be formed in the high-vacuum state described above. For example, the substrate temperature can be as high as 500° C. or more. The higher the temperature, the more formation of the crystal nuclei 206a is promoted.

Subsequently, supply of argon gas added to decrease the vacuum degree is stopped. While $O_2$ gas and $N_xO$ gas are continuously supplied together with the Ti, Ba, and Sr source gases to enable BST deposition, the reaction chamber 101 is set to a low vacuum state of about 0.1 Torr to several Torr to increase the supply amounts of the Ti, Ba, and Sr source gases. In this case as well, the heating mechanism of the substrate stage 102 is controlled so that the temperature of the wafer 103 as the processing target becomes about 450° C. The substrate temperature in the low-vacuum state is not limited to 450° C. The substrate temperature suffices as far as it is lower than a temperature at which crystal growth occurs on the heterointerface and the desired step coverage and desired thin film forming rate can be obtained. Hence, the crystal nuclei 206a grow large, as shown in FIG. 2C, to consequently form a capacitor film 206 made of BST in the crystalline state.

From the foregoing, the capacitor film 206 made of BST in the crystalline state (polycrystalline state) is formed to cover the storage nodes 205.

Subsequently, as shown in FIG. 2D, a cell plate 207 is formed on the capacitor film 206, thereby forming a capacitor 210 to be connected to the transistor 202.

After the capacitor 210 is formed, an interlevel insulating film 208 is formed on the cell plate 207, as shown in FIG. 2E. Interconnections such as a bit line are formed on the interlevel insulating film 208, so that a DRAM, in which the capacitor film 206 made of BST with a high dielectric constant is formed on the storage node 205 with good step coverage, can be obtained.

Formation of crystal nuclei described in FIG. 2B will be described in more detail.

According to MOCVD for forming a capacitor film made of BST described above, an energy such as heat is applied to a thin film forming material to be supplied as a gas onto a substrate surface, so that gas molecules are excited and decomposed to form an intermediate product (precursor). The intermediate product is then adsorbed, diffused, reacted, and dissociated on the substrate surface to form a thin film on the substrate.

When the atmosphere for the substrate in which a thin film is to be formed is set at a higher vacuum, the concentration of the supplied source gas becomes low and the density of the precursor molecules also be comes low, and surface diffusion of the molecules tends to occur more likely than collision of the molecules. In this manner, i f the precursor molecules adsorbed by the surface of the substrate as the film forming target can be sufficiently diffused on the substrate surface, crystal nuclei, which is in the most stable state in terms of thermodynamics, can be formed easily. Accordingly, if the substrate atmosphere is set at the high-vacuum state as in the first embodiment so the precursor molecules can be sufficiently diffused on the substrate surface, crystal nuclei can be formed easily even on surfaces of different types of materials.

Even in the low-vacuum state, if the partial pressures of the source gases in the gas phase are decreased, the density of the precursors adsorbed on the substrate surface also decreases. Thus, formation of nuclei is possible in the same manner as in the high-vacuum state described above.

For this reason, in the fourth embodiment, as described above, at the initial state of thin film formation by MOCVD, an inert gas such as argon gas which does not contribute to film forming reaction is added, and the vacuum degree of the atmosphere for the substrate as the thin film forming target is decreased without increasing the supply amounts of the source gases and oxidizing gas, so that high-density crystal nuclei are formed on the surface of the substrate as the thin film forming target. When the vacuum degree of the atmosphere, e.g., a reaction chamber, for the substrate as the thin film forming target is low, the respective gases can be supplied to the whole region of the substrate more uniformly, and the distribution of the crystal nuclei to be formed can be made more uniform. Since the atmosphere need not be set to a high vacuum, a high vacuum exhausting ability is not needed, and the apparatus for forming a film can accordingly be formed more inexpensive.

Figure 9:
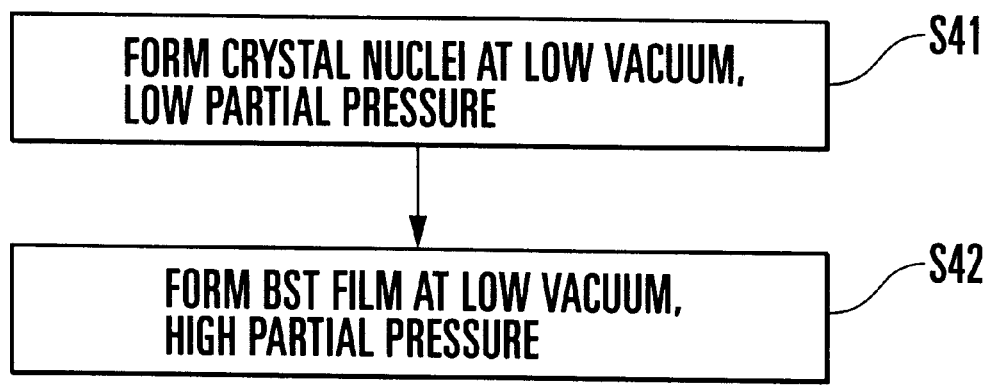
FIG. 9 is a flow chart showing a film formation process in the fourth embodiment.

In fine, in the fourth embodiment, as shown in FIG. 9, first, in step S41, for example, the source gases and oxidizing gas are supplied in an amount to achieve a high-vacuum state of $10^{-2}$ Torr or less. An inert gas such as argon gas is added to the gas mixture to achieve a low-vacuum state of about $10^{-1}$ Torr as a whole to enable BST deposition. BST crystal nuclei are formed at a desired density on a region of the substrate where BST is to be formed. In step S41, although the whole mixture is in the low-vacuum (high-pressure) state, the partial pressures of the source gases are low, and the source gases are supplied in amounts equal to those with which the high-vacuum state is obtained in the first embodiment. In step S42, the supply amount of argon gas is decreased so that the atmosphere is set to about 0.1 Torr to several Torr, which is the vacuum degree for thin film formation by ordinary MOCVD, and the source gases are supplied to enable BST deposition. The substrate temperature is set to lower than a temperature at which crystal growth occurs on the surfaces of different types of materials and a thin film can be formed with good step coverage. A BST film is then allowed to grow.

As a result, according to the fourth embodiment as well, a BST crystal film can be formed with good step coverage. According to the fourth embodiment, since a process of forming crystal nuclei is performed at a low vacuum degree (high pressure), the film can be formed more uniform, and the apparatus can be made more inexpensive.

Fifth Embodiment

The fifth embodiment of the present invention will be described. The fifth embodiment also exemplifies formation of a BST film. In the following description, the present invention will be described by way of a case wherein the BST film is used as the capacitor film of the DRAM described above. In the fifth embodiment, the CVD apparatus shown in FIG. 1 is used, in the same manner as in the first embodiment. In the fifth embodiment, a thin film forming method will be described with reference to FIGS. 2A to 2E. Hence, the fifth embodiment is identical to the first embodiment regarding FIGS. 1 to 2A and FIGS. 2C to 2E.

First, as shown in FIG. 2A, a substrate 201, on which storage nodes 205 connected to transistors 202 through plugs 203 are formed, is prepared. The storage nodes 205 are formed on an interlevel insulating film 204 formed to cover the transistors 202. The interlevel insulating film 204 is formed by depositing, e.g., silicon dioxide by CVD. Impurity-doped conductive polysilicon is charged in contact holes formed in the interlevel insulating film 204, thereby forming the plugs 203.

The storage nodes 205 are formed to be connected to the plugs 203 through barrier films 203a which are formed for suppressing mutual diffusion of materials. The storage nodes 205 are made of, e.g., Pt. For example, the plugs 203 are formed to have the barrier films 203a on their surfaces, and after that a Pt film is formed on the interlevel insulating film 204 by sputtering or the like. The Pt film is patterned by known photolithography and etching, thereby forming the storage nodes 205.

After the substrate 201 having storage nodes 205 in the above manner is prepared, it is placed as a processing target wafer 103 on the substrate stage 102 of the CVD apparatus shown in FIG. 1. The interior of the reaction chamber 101 in which the wafer 103 is arranged is set to a high vacuum of, e.g., about $10^{-2}$ Torr or less, and $O_2$ gas and $N_2$ gas are supplied together with Ti, Ba, and Sr source gases into the reaction chamber 101 to enable BST deposition. At this time, the heating mechanism of the substrate stage 102 is controlled so that the temperature of the wafer 103 as the processing target becomes about 450° C. As the result of this temperature control, crystal nuclei 206a of BST are formed at least on the surfaces of the storage nodes 205, as shown in FIG. 2B. The substrate temperature during formation of the crystal nuclei is not limited to 450° C., and suffices as far as it is equal to or higher than a temperature at which crystal nuclei can be formed in the high-vacuum state described above. For example, the substrate temperature can be as high as 500° C. or more. The higher the temperature, the more formation of the crystal nuclei 206a is promoted.

In the fifth embodiment, after the crystal nuclei 206 are formed, supply of the respective gases into the reaction chamber 101 is stopped, and a state wherein the substrate 201 is merely heated is held for about 1 to 3 min. The temperature of the substrate 201 is set to about 450° C. by controlling the heating mechanism of the substrate stage 102. This heating-only step can improve the crystalline state of the crystal nuclei 206 formed on the substrate 201.

Subsequently, $O_2$ gas and $N_xO$ gas are supplied again together with the Ti, Ba, and Sr source gases to set the reaction chamber 101 to a low vacuum state of about 0.1 Torr to several Torr, to enable BST deposition. In this case, the supply amounts of the Ti, Ba, and Sr source gases are increased from the beginning. In this case as well, the heating mechanism of the substrate stage 102 is controlled so that the temperature of the wafer 103 as the processing target becomes about 450° C. The substrate temperature in the low-vacuum state is not limited to 450° C. The substrate temperature suffices as far as it is lower than a temperature at which crystal growth occurs on the heterointerface and the desired step coverage and desired thin film forming rate can be obtained. Hence, the crystal nuclei 206a grow large, as shown in FIG. 2C, to consequently form a capacitor film 206 made of BST in the crystalline state.

From the foregoing, the capacitor film 206 made of BST in the crystalline state (polycrystalline state) is formed to cover the storage nodes 205. In the fifth embodiment, after the crystal nuclei are formed, the capacitor film is not formed immediately, but a step of merely heating the crystal nuclei is added to improve the crystalline state of the crystal nuclei. This improves the crystallizability of the capacitor film obtained by crystal growth of the crystal nuclei, and the film can be formed with higher film quality.

Subsequently, as shown in FIG. 2D, a cell plate 207 is formed on the capacitor film 206, thereby forming a capacitor 210 to be connected to the transistor 202.

After the capacitor 210 is formed, an interlevel insulating film 208 is formed on the cell plate 207, as shown in FIG. 2E. Interconnections such as a bit line are formed on the interlevel insulating film 208, so that a DRAM, in which the capacitor film 206 made of BST with a high dielectric constant is formed on the storage node 205 with good step coverage, can be obtained.

Figure 10:
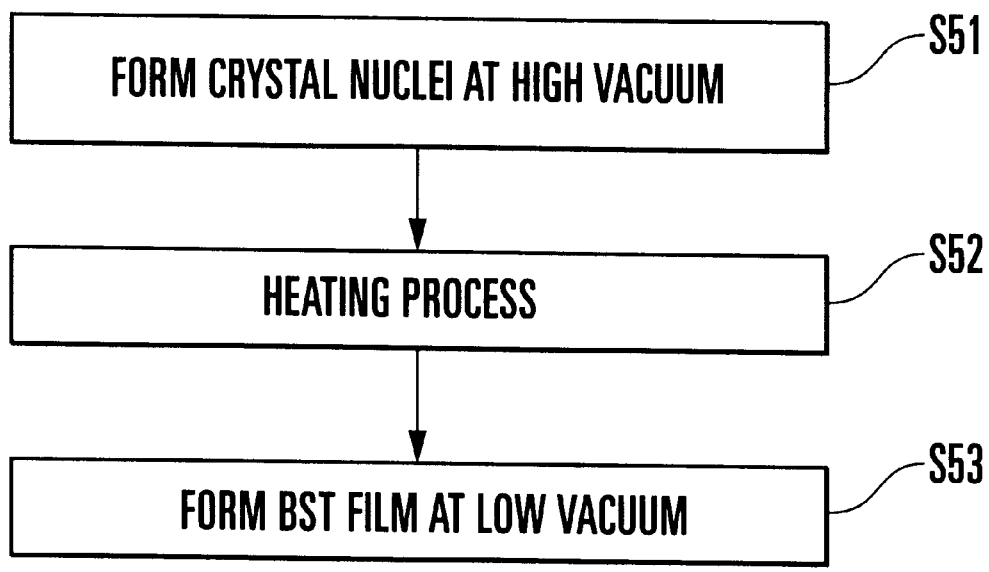
FIG. 10 is a flow chart showing a film formation process in the fifth embodiment.

In fine, in the fifth embodiment, as shown in FIG. 10, first, in step S51, the atmosphere is set at a higher vacuum of, e.g., $10^{-2}$ Torr or less, and the source gases are supplied to enable BST deposition. BST crystal nuclei are formed at a desired density on a region of the substrate where BST is to be formed. In step S52, supply of the respective gases is stopped, and a state wherein the substrate is merely heated is held for a predetermined period of time. In step S53, the atmosphere is set to about 0.1 Torr to several Torr, which is the vacuum degree for thin film formation by ordinary MOCVD, and the source gases are supplied again to enable BST deposition. The substrate temperature is set to less than a temperature at which crystal growth occurs on the surfaces of different types of materials and a thin film can be formed with good step coverage. A BST film is then allowed to grow.

As a result, according to the fifth embodiment as well, a BST crystal film can be formed with good step coverage, in the same manner as in the first embodiment described above. In addition, in the fifth embodiment, after the crystal nuclei are formed, a step of merely heating the crystal nuclei is added before film formation. This can improve the crystalline state of the crystal nuclei, and the quality of the BST film which grows from the crystal nuclei can be improved.

In addition, after the crystal nuclei are formed, in the step of performing merely heating, an oxidizing gas such as nitrogen dioxide ($NO_2$) may be doped in the substrate where the crystal nuclei are formed. After the crystal nuclei are formed, if not only the substrate is heated but also an oxidizing gas is doped in the substrate, the crystalline state of the crystal nuclei can be much improved. This will be described in detail. Some oxygen defects exist in the formed crystal nuclei. The crystal defects can be compensated for by introducing oxygen gas onto the substrate formed with the crystal nuclei in the heating step, so that the crystalline state can be more improved. Since organometals are used as the source gases, the carbon compound residue is present on the formed crystal nuclei and near them. When an oxidizing gas is introduced in the heating step, the carbon compound residue can be oxidized, gasified, and removed.

In the above embodiment, a CVD apparatus for supplying the source gases by heating and sublimating solid materials is used. However, the present invention is not limited to this. When a CVD apparatus is employed which supplies source gases by dissolving sources in organic solvents and evaporating the resultant solutions, almost the same effect can be obtained.

Figure 11:
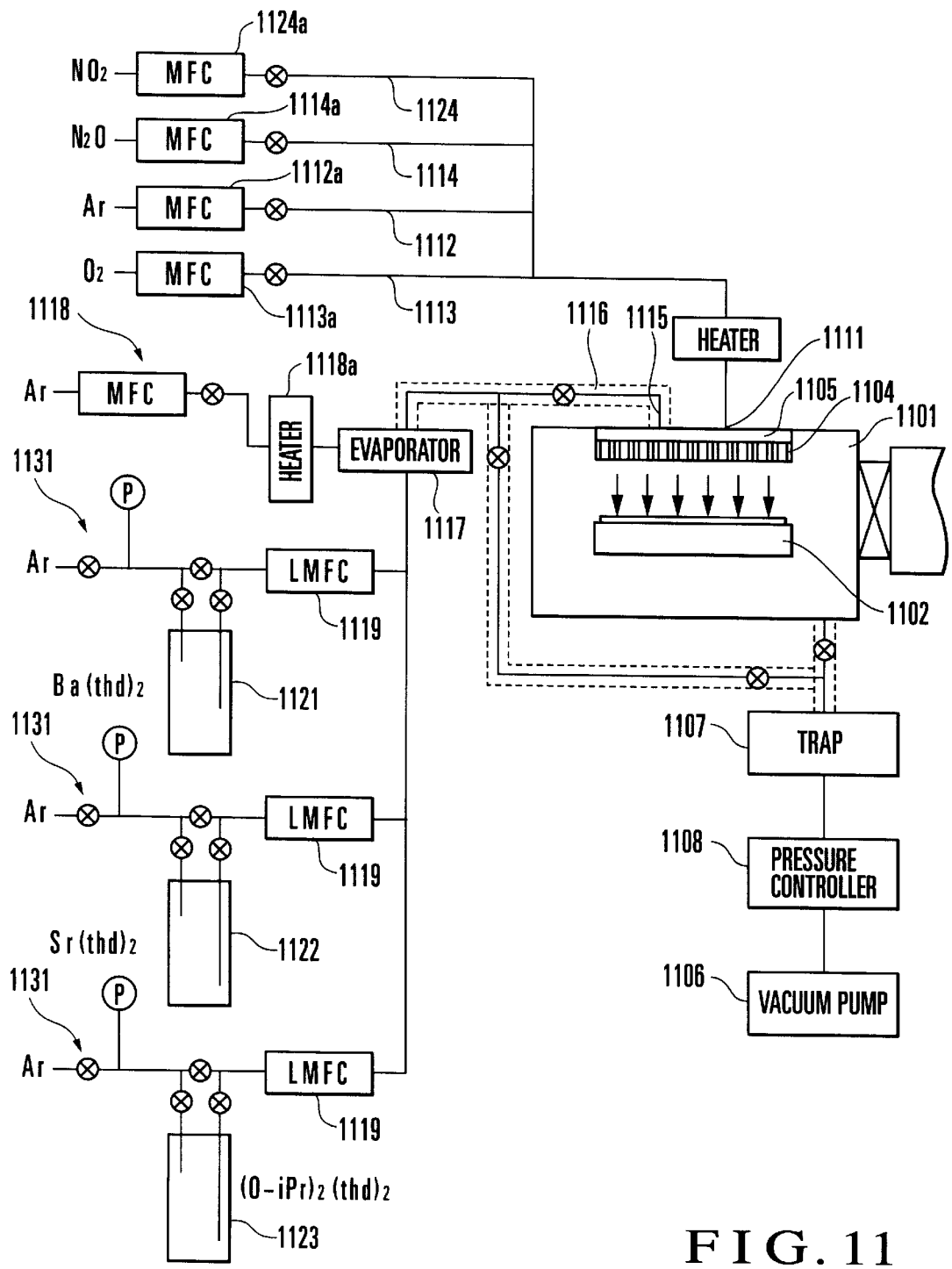
FIG. 11 is a view showing the schematic arrangement of another CVD apparatus used in an embodiment of the present invention.
Figure 12:
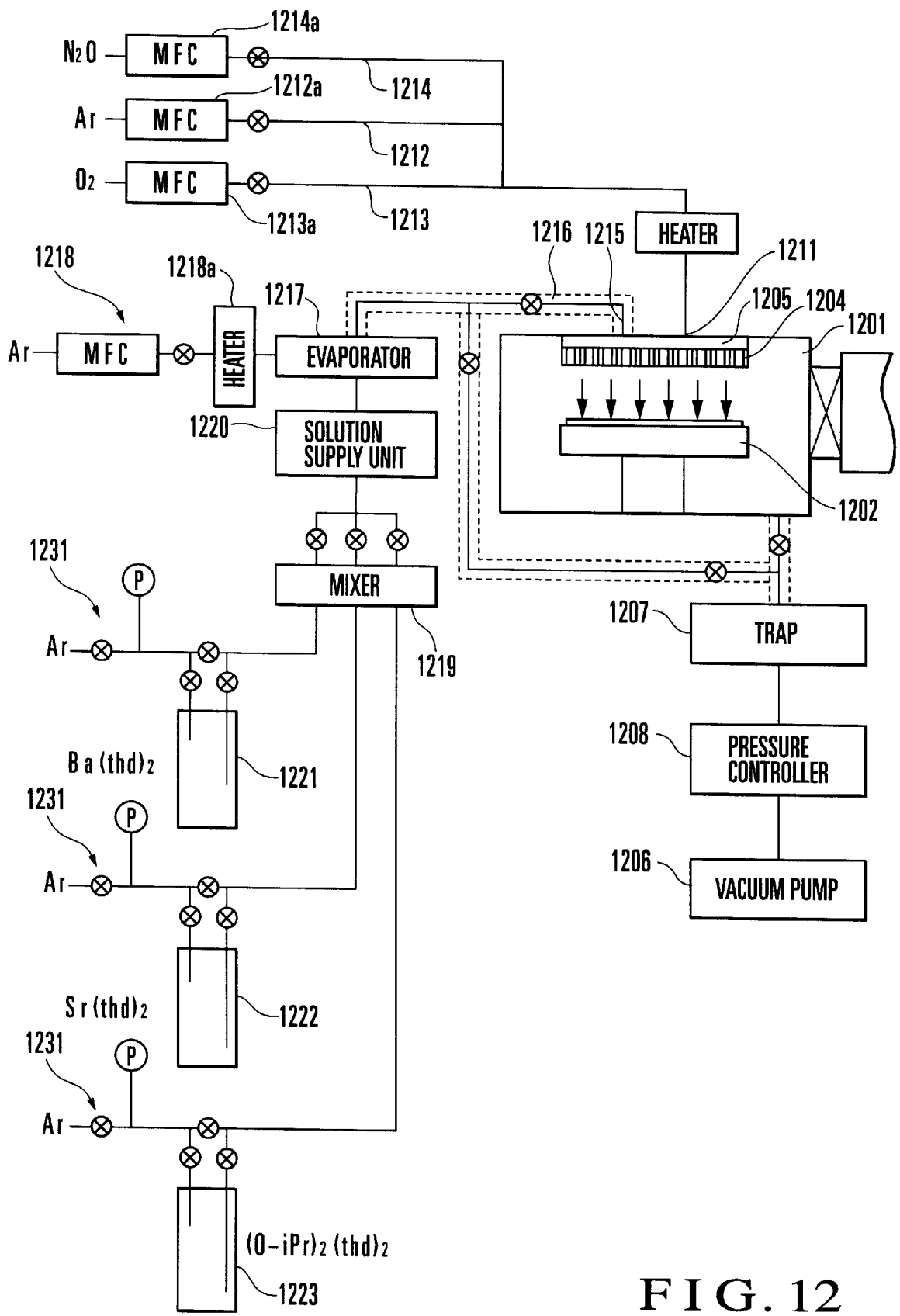
FIG. 12 is a view showing the schematic arrangement of still another CVD apparatus used in an embodiment of the present invention.
Figure 13:
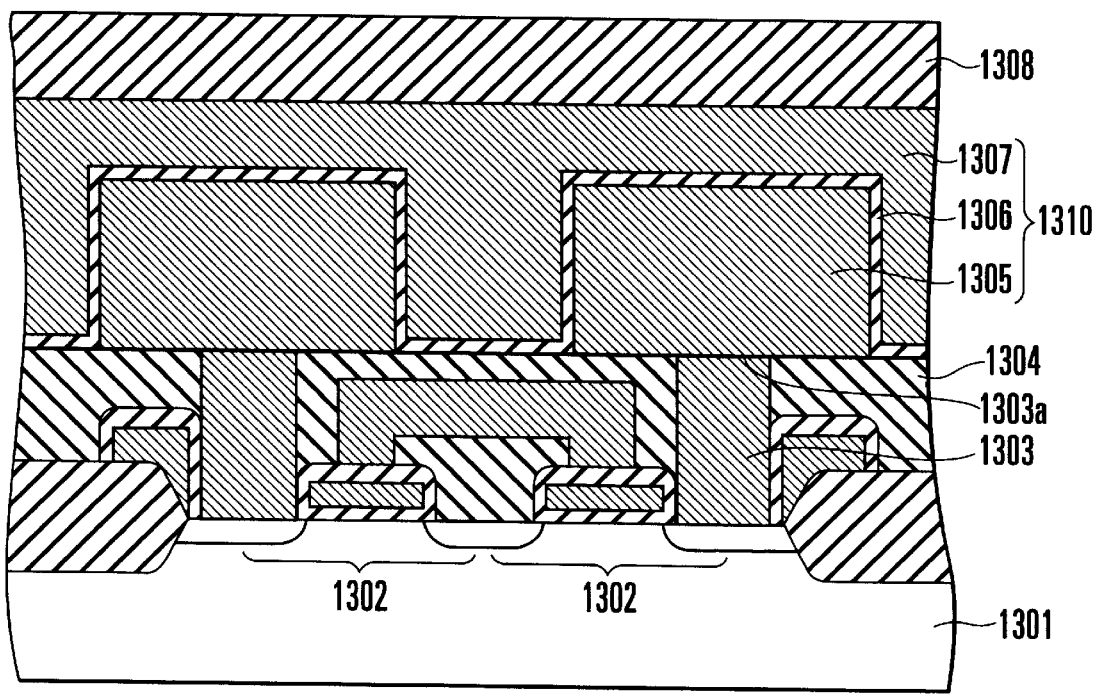
FIG. 13 is a sectional view schematically showing the arrangement of a general DRAM.

FIGS. 11 and 12 show the schematic arrangements of CVD apparatuses for supplying source gases by evaporating solutions. The CVD apparatus shown in FIG. 11 will be described first. A reaction chamber 1101 is a hermetic vessel. A substrate stage 1102 placed on a base is arranged in the reaction chamber 1101, and a wafer 1103 can be placed on the substrate stage 1102.

Although not shown in FIG. 11, the wall of the reaction chamber 1101 can be heated by a heating means arranged around the reaction chamber 1101 to 250° C.

The substrate stage 1102 has a built-in heater for heating the wafer 1103 from below. Although not shown, in order to generate a plasma in the reaction chamber 1101, an electrode connected to RF power supply is also arranged in the substrate stage 1102 to supply RF power into the reaction chamber 101.

A diffusion plate 1104 is arranged on the upper surface in the reaction chamber 1101 to oppose the substrate stage 1102. A mixture 1105 is arranged on the rear surface of the diffusion plate 1104. Gases to be introduced into the reaction chamber 1101 are mixed by the mixer 1105, and the gas mixture is supplied to the diffusion plate 1104.

The interior of the reaction chamber 1101 is evacuated by a vacuum pump 1106, and an exhaust line extending from the reaction chamber 1101 to vacuum pump 1106 has a trap 1107 and pressure controller 1108. The trap 1107 removes, from the exhaust line, that material in an exhaust gas which is liquid at room temperature. The pressure controller 1108 controls the vacuum degree in the reaction chamber 1101. The maximum target vacuum degree is determined by the exhaust ability of the vacuum pump 1106.

So far, this CVD apparatus is almost similar to that shown in FIG. 1.

How to supply the respective gases to be introduced to the reaction chamber 1101 will be described.

Ar gas, $O_2$ gas, and $N_2O$ gas are introduced into the reaction chamber 1101 through a gas supply portion 1111. The gas supply portion 1111 is connected to an Ar gas line 1112, $O_2$ gas line 1113, and $N_2O$ gas line 1114. The gas supply portion 1111 is also connected to an $NO_2$ line 1124. Hence, the crystalline state of the crystal nuclei can be improved upon doping nitrogen dioxide gas described above. Microflow controllers (MFCs) 1112a, 1113a, and 1114a for controlling the flow rates of the gases to be supplied are provided midway along the respective gas lines 1112, 1113, and 1114, to control the supply amounts of the gases to be supplied into the reaction chamber 1101. $O_2$, $N_2$, and $NO_2$ are gases for forming oxides, of which $NO_2$ gas has a particularly strong oxidizing power. Ar gas is used for dilution and to generate a plasma. These gases are supplied in substantially the same manner as in the CVD apparatus of FIG. 1.

The source gases as thin film forming materials are supplied through the gas supply portion 1115. The gas supply portion 1115 is connected to an evaporated gas line 1116. The evaporated gas line 1116 is heated to, e.g., about 230° C. to 250° C.

The evaporated gas line 1116 is connected, through an evaporator 1117, to respective source solution supply units 1121, 1122, and 1123 for supplying solutions of organometallic compounds as materials that form a thin film. An Ar gas line 1118 is introduced to the evaporator 1117 to supply Ar gas heated by a heater 111a to it.

Ar gas lines 1131 are respectively connected to the source solution supply units 1121 to 1123 to supply pressurized Ar gas to them as a back pressure.

Due to the back pressure of the supplied Ar gas, butyl acetate solutions of the organometallic compounds are supplied from the respective source solution supply units 1121 to 1123 to the evaporator 1117. The amounts of the solutions to be supplied from the respective source solution supply units 1121 to 1123 are controlled by LMFCs 1119 that control solution supply amounts.

The source solution supply unit 1121 stores Ba(thd)$_2$ dissolved in butyl acetate. The source solution supply unit 1122 stores Sr(thd)$_2$ dissolved in butyl acetate. The source solution supply unit 1123 stores Ti(O—iPr)$_2$(thd)$_2$ dissolved in butyl acetate.

Of the source solution supply units 1121 to 1123, for example, the source solution supply unit 1121 supplies the butyl acetate solution of Ba(thd)$_2$ stored in it to the evaporator 1117 to evaporate the solution. The gas evaporated by the evaporator 1117 is supplied to the gas supply portion 1115 through the evaporated gas line 1115. If the temperature drops, a gas obtained by evaporating the butyl acetate solution of an organometallic compound liquefies and solidifies quickly to clog the gas line. However, as the evaporated gas line 1116 is heated to about 230° C. to 250° C., the evaporated gas passing through the evaporated gas line 1116 is introduced to the reaction chamber 1101 while maintaining the gaseous state.

The CVD apparatus shown in FIG. 12 will now be described. A reaction chamber 1201 of this CVD apparatus is a hermetic vessel. A substrate stage 1202 placed on a base is arranged in the reaction chamber 1201, and a wafer 1203 can be placed on the substrate stage 1202. Although not shown in FIG. 12, the wall of the reaction chamber 1201 can be heated by a heating means arranged around the reaction chamber 1201 to 250° C. The substrate stage 1202 has a built-in heater for heating the wafer 1203 from below. Although not shown, in order to generate a plasma in the reaction chamber 1201, an electrode connected to RF power supply is also arranged in the substrate stage 1202 to supply RF power into the reaction chamber 1201.

A diffusion plate 1204 is arranged on the upper surface in the reaction chamber 1201 to oppose the substrate stage 1202. A mixer 1205 is arranged on the rear surface of the diffusion plate 1204. Gases to be introduced into the reaction chamber 1201 are mixed by the mixer 1205, and the gas mixture is supplied to the diffusion plate 1204.

The interior of the reaction chamber 1201 is evacuated by a vacuum pump 1206, and an exhaust line extending from the reaction chamber 1201 to vacuum pump 1206 has a trap 1207 and pressure controller 1208. The trap 1207 removes, from the exhaust line, that material in an exhaust gas which is liquid at room temperature. The pressure controller 1208 controls the vacuum degree in the reaction chamber 1201. The maximum target vacuum degree is determined by the exhaust ability of the vacuum pump 1206.

So far, this CVD apparatus is almost similar to that shown in FIG. 1.

How to supply the respective gases to be introduced to the reaction chamber 1201 will be described.

Ar gas, O$_2$ gas, and the like are introduced into the reaction chamber 1201 through a gas supply portion 1211. The gas supply portion 1211 is connected to an Ar gas line 1212, O$_2$ gas line 1213, and N$_2$O gas line 1214. Microflow controllers (MFCs) 1212a, 1213a, and 1214a for controlling the flow rates of the gases to be supplied are provided midway along the respective gas lines 1212, 1213, and 1214. O$_2$ and N$_2$O are gases for forming oxides. Ar gas is used for dilution and to generate a plasma. These gases are supplied in substantially the same manner as in the CVD apparatus of FIG. 1.

The source gases as thin film forming materials are supplied from a gas supply portion 1215. The gas supply portion 1215 is connected to an evaporated gas line 1216. The evaporated gas line 1216 is heated to, e.g., about 230° C. to 250° C.

The evaporated gas line 1216 is connected, through an evaporator 1217, to respective source solution supply units 1221, 1222, and 1223 for supplying solutions of organometallic compounds as materials that form a thin film. An Ar gas line 1218 is introduced to the evaporator 1217 to supply Ar gas heated by a heater 1218a to it.

Ar gas lines 1231 are connected to the source solution supply units 1221 to 1223 to supply pressurized Ar gas to them as a back pressure.

Due to the back pressure of the supplied Ar gas, butyl acetate solutions of the organometallic compounds are supplied from the respective source solution supply units 1221 to 1223 to the evaporator 1217. The butyl acetate solutions supplied from the respective source solution supply units 1221 to 1223 are mixed by a mixer 1219. The solution mixture is flow-rate controlled by a solution supply unit 1220, and is supplied to the evaporator 1217.

The source solution supply unit 1221 stores Ba(thd)$_2$ dissolved in butyl acetate. The source solution supply unit 1222 stores Sr$_2$ dissolved in butyl acetate. The source solution supply unit 1223 stores Ti(O—iPr)$_2$(thd)$_2$ dissolved in butyl acetate.

Of the source solution supply units 1221 to 1223, for example, the source solution supply unit 1221 supplies the butyl acetate solution of Ba(thd)$_2$ stored in it to the evaporator 1217 to evaporate the solution. The gas evaporated by the evaporator 1217 is supplied to the gas supply portion 1215 through the evaporated gas line 1216. If the temperature drops, a gas obtained by evaporating the butyl acetate solution of an organometallic compound liquefies and solidifies quickly to clog the gas line. However, as the evaporated gas line 1216 is heated to about 230° C. to 250° C., the evaporated gas passing through the evaporated gas line 1216 is introduced to the reaction chamber 1201 while maintaining the gaseous state.

When the CVD apparatuses described above, in each of which the source gas is supplied by evaporating a solution obtained by dissolving a source in an organic solvent, is used, the same effect as that described above can be obtained. Note that the CVD apparatus described above, in which the source gas is supplied by heating and sublimating the solid material, can supply a purer material to the reaction chamber, so that crystal nuclei can be formed more easily.

In the above embodiments, BST crystal nuclei are formed at a high density. However, the present invention is not limited to this. Alternatively, at the initial stage, BT or ST crystal nuclei may be formed at a high density. If BT or ST crystal nuclei are formed at a high density, even in a low-temperature range where crystal growth does not occur, a BST crystal film grows from many crystal nuclei formed at a high density.

Similarly, the present invention can be applied not only to formation of a BST film but also to formation of an ST or BT crystal film, as a matter of course.

In the above description, Ti(O—iPr)$_2$(thd)$_2$ is used as the Ti source. However, the present invention is not limited to this.

TO(thd)$_2$ or Ti(O—iPr)$_4$ [TTIP] may be used as the Ti source.

As has been described above, according to the present invention, as the first step, an atmosphere is set to a first vacuum degree, and a gas of an organometallic compound and oxygen gas are introduced onto a surface of a substrate heated to a first temperature, to form a plurality of crystal nuclei, which are made of an oxide of a metal constituting the organometallic compound, on the surface of the substrate. Subsequently, as the second step, the atmosphere is set to a second vacuum degree lower in vacuum than in the first step, and the gas of the organometallic compound and the oxygen gas are introduced onto the surface of the substrate heated to a second temperature, to form a crystal thin film made of an oxide of the metal on the surface of the substrate. In the first step, the first vacuum degree is set to a vacuum degree at which the oxide of the metal is formed by crystal growth on surfaces of different materials, and the plurality of crystal nuclei are formed at a high density so that a crystal grain which is formed by a crystal nucleus upon growing comes into contact with a crystal grain growing from an adjacent crystal nucleus. In the second step, the second temperature is set to less than a temperature at which the oxide of the metal is formed by crystal growth on the surfaces of the different materials.

Alternatively, as the pre-process, a surface of a substrate as a thin film forming target is exposed to a plasma. After that, as the first step, an atmosphere is set to a first vacuum degree, and a gas of an organometallic compound and oxygen gas are introduced onto the surface of the substrate heated to a first temperature, to form a plurality of crystal nuclei, which are made of an oxide of a metal constituting the organometallic compound, on the surface of the substrate. Subsequently, as the second step, the atmosphere is set to a second vacuum degree, and the gas of the organometallic compound and oxygen gas are introduced onto the surface of the substrate heated to a second temperature, to form a film made of an oxide of the metal on the surface of the substrate. In the first step, the first vacuum degree is set to a vacuum degree at which the oxide of the metal is formed by crystal growth on the surface of the substrate, which has been subjected to the pre-process, at the first temperature, and the plurality of crystal nuclei are formed at a high density so that a crystal grain which is formed by growing a crystal nucleus comes into contact with a crystal grain growing from an adjacent crystal nucleus. In the second step, the second temperature is set to less than a temperature at which the oxide of the metal is formed by crystal growth on surfaces of different materials.

Alternatively, as the first step, an atmosphere is set to a first vacuum degree, and a gas of an organometallic compound and oxygen gas are introduced onto a surface of the substrate heated to a first temperature, to form a plurality of crystal nuclei, which are made of an oxide of a metal constituting the organometallic compound, on the surface of the substrate. As the second step, the atmosphere is set to a second vacuum degree, and the gas of the organometallic compound and oxygen gas are introduced onto the surface of the substrate heated to a second temperature, to form a film made of the oxide of the metal on the surface of the substrate. In the first step, the first temperature is set to a temperature at which the oxide of the metal is formed by crystal growth on surfaces of different materials, and the plurality of crystal nuclei are formed at a high density so that a crystal grain which is formed by growing a crystal nucleus comes into contact with a crystal grain growing from an adjacent crystal nucleus. In the second step, the second temperature is set to less than a temperature at which the oxide of the metal is formed by crystal growth on the surfaces of the different materials.

Alternatively, the present invention comprises the first step of setting an atmosphere for a substrate as a thin film forming target to a predetermined vacuum degree, and introducing a gas of an organometallic compound, an oxidizing gas, and an inert gas onto a surface of the substrate heated to a first temperature, to form a plurality of crystal nuclei, which are made of an oxide of a metal constituting the organometallic compound, on the surface of the substrate, and the second step of setting the atmosphere for the substrate to a predetermined vacuum degree, and introducing the gas of the organometallic compound and the oxidizing gas onto the surface of the substrate heated to a second temperature, to form a film made of the oxide of the metal on the surface of the substrate. In the first step, a partial pressure of the organometallic compound on the substrate is set to a vacuum degree at which the oxide of the metal is formed by crystal growth on surfaces of different materials at the first temperature, and the plurality of crystal nuclei are formed at a high density so that a crystal grain which is formed by growing a crystal nucleus comes into contact with a crystal grain growing from an adjacent crystal nucleus. In the second step, the second temperature is set to less than a temperature at which the oxide of the metal is formed by crystal growth on the surfaces of the different materials.

The thin film is formed in the above manner. Thus, the crystal nuclei are formed while suppressing the amount of organometallic compound by setting the atmosphere to a high vacuum state, or by adding an inert gas. After that, the substrate temperature is set to a value providing a good step coverage and within a temperature range where a metal oxide is not formed by crystal growth on the surfaces of different materials, and a crystal film of a metal oxide such as BST is formed.

According to the present invention, since a process of forming crystal nuclei is merely added, the number of steps does not increase. Since the process of forming crystal nuclei is merely added, it suffices if a CVD apparatus with a reaction chamber that can be evacuated is used, and the system size does not increase. In other words, the present invention has an excellent effect in that it can form a crystal film of a metal oxide such as BST on the stepped surfaces of different types of materials, to have good step coverage while suppressing the cost.

What is claimed is:

1. A thin film forming method, comprising:
    a first step of setting an atmosphere for a base as a thin film forming target to a first vacuum degree, and introducing a gas of an organometallic compound and an oxidizing gas onto a surface of the base heated to a first temperature, to form a plurality of crystal nuclei, which are made of an oxide of a metal constituting the organometallic compound, on the surface of the base;
    a second step of setting the atmosphere for the base to a second vacuum degree lower in vacuum than in the first step, and introducing the gas of the organometallic compound and the oxidizing gas onto the surface of the base heated to a second temperature, to form a film made of an oxide of the metal on the surface of the base;
    the first step comprising setting the first vacuum degree to a vacuum degree at which the oxide of the metal is formed by crystal growth on surfaces of different materials, and forming the plurality of crystal nuclei at a high density so that a crystal grain which is formed by growing a crystal nucleus comes into contact with a crystal grain growing from an adjacent crystal nucleus, and
    the second step comprising setting the second temperature to less than a temperature at which the oxide of the metal is formed by crystal growth on the surfaces of the different materials.

2. A thin film forming method according to claim 1, wherein after the first step a gas of the atmosphere for the base is removed, the base is held at a third temperature for a period of time, and the second step is performed.

3. A thin film forming method according to claim 2, wherein the third temperature is equal to the first temperature.

4. A thin film forming method according to claim 2, wherein the oxidizing gas is introduced to the atmosphere for the base while the base is kept at the third temperature.

5. A thin film forming method according to claim 4, wherein the oxidizing gas is nitrogen dioxide.

6. A thin film forming method according to claim 1, wherein the base is heated by irradiating the surface of the base, where a thin film is to be formed, with infrared rays from an infrared lamp.

7. A thin film forming method according to claim 1, wherein the organometallic compound contains an organic compound of titanium and one of an organic compound of strontium and an organic compound of barium.

8. A thin film forming method according to claim 1, wherein the organometallic compound contains an organic compound of strontium, an organic compound of barium. and an organic compound of titanium.

9. A thin film forming method according to claim 8, wherein,
the first step comprises introducing a gas of the organic compound of titanium, the oxidizing gas, and one of a gas of the organic compound of strontium and a gas of the organic compound of barium onto the surface of the base, and
the second step comprises introducing the gas of the organic compound of strontium, the gas of the organic compound of barium, the gas of the organic compound of titanium, and the oxidizing gas onto the surface of the base.

10. A thin film forming method, comprising:
a first step of setting an atmosphere for a base as a thin film forming target to a first vacuum degree, and introducing a gas of an organometallic compound and an oxidizing gas onto a surface of the base heated to a first temperature while the gas of the organometallic compound and the oxidizing gas are being introduced, to form a plurality of crystal nuclei, which are made of an oxide of a metal constituting the organometallic compound, on the surface of the base;
a second step of setting the atmosphere for the base to a second vacuum degree, and introducing the gas of the organometallic compound and the oxidizing gas onto the surface of the base heated to a second temperature, to form a film made of the oxide of the metal on the surface of the base;
the first step comprising setting the first temperature to a temperature at which the oxide of the metal is formed by crystal growth on surfaces of different materials, and forming the plurality of crystal nuclei at a high density so that a crystal grain which is formed by growing a crystal nucleus comes into contact with a crystal grain growing from an adjacent crystal nucleus, and
the second step comprising setting the second temperature to less than a temperature at which the oxide of the metal is formed by crystal growth on the surfaces of the different materials.

11. A thin film forming method according to claim 10, wherein the second step comprises setting the second temperature to less than a temperature at which the oxide of the metal is formed by crystal growth on the surfaces of the different materials, and the second temperature is lower than the first temperature.

12. A thin film forming method, comprising:
a first step of setting an atmosphere for a base as a thin film forming target to a first vacuum degree, and introducing a gas of an organometallic compound and an oxidizing gas onto a surface of the base heated to a first temperature while the gas of the organometallic compound and the oxidizing gas are being introduced, to form a plurality of crystal nuclei, which are made of an oxide of a metal constituting the organometallic compound, on the surface of the base;
a second step of setting the atmosphere for the base to a second vacuum degree, and introducing the gas of the organometallic compound and the oxidizing gas onto the surface of the bass heated to a second temperature, to form a film made of an oxide of the metal on the surface of the base;
the first step comprising setting the first temperature to a temperature at which the oxide of the metal is formed by crystal growth on surfaces of different materials, and forming the plurality of crystal nuclei at a high density so that a crystal grain which is formed by growing a crystal nucleus comes into contact with a crystal grain growing from an adjacent crystal nucleus;
the second step comprising setting the second temperature to less than a temperature at which the oxide of the metal is formed by crystal growth on the surfaces of the different materials; and
the second step being performed when gas supply is stopped for a period of time after the first step.

13. A thin film forming method according to claim 12, wherein the second step comprises setting the second temperature to less than a temperature at which the oxide of the metal is formed by crystal growth on the surfaces of the different materials, and the second temperature is lower than the first temperature.

14. A thin film forming method, comprising:
a preprocessing step of exposing a surface of a base as a thin film forming target to a plasma;
a first step of setting an atmosphere for the base to a first vacuum degree, and introducing a gas of an organometallic compound and an oxidizing gas onto the surface of the base heated to a first temperature, to form a plurality of crystal nuclei, which are made of an oxide of a metal constituting the organometallic compound, on the surface of the base;
a second step of setting the atmosphere for the base to a second vacuum degree, and introducing the gas of the organometallic compound and the oxidizing gas onto the surface of the base heated to a second temperature, to form a film made of an oxide of the metal on the surface of the base;
the first step comprising setting the first vacuum degree to a vacuum degree at which the oxide of the metal is formed by crystal growth on the surface of the base subjected to the pre-process, and forming the plurality of crystal nuclei at a high density so that a crystal grain which is formed by growing a crystal nucleus comes into contact with a crystal grain growing from an adjacent crystal nucleus; and
the second step comprising setting the second temperature to less than a temperature at which the oxide of the metal is formed by crystal growth on surfaces of different materials.

15. A thin film forming method, comprising:

a first step of setting an atmosphere for a base as a thin film forming target to a first vacuum degree, and introducing a gas of an organometallic compound, an oxidizing gas, and an inert gas onto a surface of the base heated to a first temperature while the gas of the organometallic compound, the oxidizing gas, and the inert gas are being introduced, to form a plurality of crystal nuclei, which are made of an oxide of a metal constituting the organometallic compound, on the surface of the base;

a second step of setting the atmosphere for the base to a second vacuum degree, and introducing the gas of the organometallic compound and the oxidizing gas onto the surface of the base heated to a second temperature, to form a film made of the oxide of the metal on the surface of the base, the first step comprising setting a partial pressure of a gas of the organometallic compound to a pressure at which the oxide of the metal is formed by crystal growth on surfaces of different materials at the first temperature, and forming the plurality of crystal nuclei at a high density so that a crystal grain which is formed by growing a crystal nucleus comes into contact with a crystal grain growing from an adjacent crystal nucleus; and the second step comprising setting the second temperature to less than a temperature at which the oxide of the metal is formed by crystal growth on the surfaces of the different materials.

16. A thin film forming method, comprising:

a first step of setting an atmosphere for a base as a thin film forming target to a first vacuum degree, and introducing a gas of an organometallic compound, an oxidizing gas, and an inert gas onto a surface of the base heated to a first temperature while the gas of the organometallic compound, the oxidizing gas, and the inert gas are being introduced, to form a plurality of crystal nuclei, which are made of an oxide of a metal constituting the organometallic compound, on the surface of the base;

a second step of setting the atmosphere for the base to a second vacuum degree, and introducing the gas of the organometallic compound and the oxidizing gas onto the surface of the base heated to a second temperature, to form a film made of the oxide of the metal on the surface of the base;

the first step comprising setting a partial pressure of a gas of the organometallic compound to a pressure at which the oxide of the metal is formed by crystal growth on surfaces of different materials at the first temperature, and forming the plurality of crystal nuclei at a high density so that a crystal grain which is formed by growing a crystal nucleus comes into contact with a crystal grain growing from an adjacent crystal nucleus;

the second step comprising setting the second temperature to less than a temperature at which the oxide of the metal is formed by crystal growth on the surfaces of the different materials, and the second step being performed when gas supply is stopped for a period of time after the first step.

17. A thin film forming method, comprising:

a first step of setting an atmosphere for a base as a thin film forming target to a first vacuum degree, and introducing a first gas comprising an organometallic compound and an oxidizing gas onto a surface of the base heated to a first temperature while the first gas is being introduced, to form a plurality of crystal nuclei, which are made of an oxide of a first metal constituting the organometallic compound, on the surface of the base;

a second step of setting the atmosphere for the base to a second vacuum degree, and introducing a second gas comprising an organometallic compound and an oxidizing gas onto the surface of the base heated to a second temperature, to form a film made of an oxide of a second metal constituting the organometallic compound on the surface of the base;

the first step comprising setting the first temperature to a temperature at which the oxide of the first metal is formed by crystal growth on surfaces of different materials, and forming the plurality of crystal nuclei at a high density so that a crystal grain which is formed by growing a crystal nucleus comes into contact with a crystal grain growing from an adjacent crystal nucleus, and the second step comprising setting the second temperature to less than a temperature at which the oxide of the second metal is formed by crystal growth on the surfaces of the different materials.

18. A thin film forming method, comprising:

a first step of setting an atmosphere for a base as a thin film forming target to a first vacuum degree, and introducing a first gas comprising an organometallic compound, an oxidizing gas, and an inert gas onto a surface of the base heated to a first temperature while the first gas is being introduced, to form a plurality of crystal nuclei, which are made of an oxide of a first metal constituting the organometallic compound, on the surface of the base;

a second step of setting the atmosphere for the base to a second vacuum degree, and introducing a second gas comprising the organometallic compound and the oxidizing gas onto the surface of the base heated to a second temperature, to form a film made of an oxide of a second metal on the surface of the base, the first step comprising setting a partial pressure of a gas of the organometallic compound to a pressure at which the oxide of the first metal is formed by crystal growth on surfaces of different materials at the first temperature, and forming the plurality of crystal nuclei at a high density so that a crystal grain which is formed by growing a crystal nucleus comes into contact with a crystal grain growing from an adjacent crystal nucleus; and the second step comprising setting the second temperature to less than a temperature at which the oxide of the second metal is formed by crystal growth on the surfaces of the different materials.

* * * * *

UNITED STATES PATENT AND TRADEMARK OFFICE
CERTIFICATE OF CORRECTION

PATENT NO. : 6,485,564 B1
DATED : November 26, 2002
INVENTOR(S) : Yijun Liu et al.

It is certified that error appears in the above-identified patent and that said Letters Patent is hereby corrected as shown below:

<u>Title page,</u>
Item [57], ABSTRACT,
Line 11, "45º C," should read -- 450º C. --.

<u>Column 25,</u>
Line 23, "barium." should read -- barium, --.

<u>Column 26,</u>
Line 17, "bass" should read -- base --.

Signed and Sealed this

First Day of April, 2003

JAMES E. ROGAN
*Director of the United States Patent and Trademark Office*